US012199139B2

(12) United States Patent
Hsu et al.

(10) Patent No.: US 12,199,139 B2
(45) Date of Patent: Jan. 14, 2025

(54) TRENCH CAPACITOR FILM SCHEME TO REDUCE SUBSTRATE WARPAGE

(71) Applicant: Taiwan Semiconductor Manufacturing Company, Ltd., Hsinchu (TW)

(72) Inventors: Ting-Chen Hsu, Taichung (TW); Hsin-Li Cheng, Hsin Chu (TW); Jyun-Ying Lin, Wujie Township (TW); Yingkit Felix Tsui, Cupertino, CA (US); Shu-Hui Su, Tucheng (TW); Shi-Min Wu, Changhua County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 255 days.

(21) Appl. No.: 17/861,755

(22) Filed: Jul. 11, 2022

(65) Prior Publication Data

US 2024/0014254 A1    Jan. 11, 2024

(51) Int. Cl.
*H10B 12/00*   (2023.01)
*H01L 29/66*   (2006.01)
*H01L 29/94*   (2006.01)
*H01L 49/02*   (2006.01)

(52) U.S. Cl.
CPC ............. *H01L 28/91* (2013.01); *H01L 28/75* (2013.01); *H01L 29/66181* (2013.01); *H01L 29/945* (2013.01); *H10B 12/033* (2023.02); *H10B 12/038* (2023.02)

(58) Field of Classification Search
CPC ............. H01L 29/945; H01L 29/66181; H01L 28/90–92; H10B 12/038; H10B 12/033
See application file for complete search history.

(56) References Cited

U.S. PATENT DOCUMENTS

| 10,693,019 B2 | 6/2020 | Cheng et al. |
| 11,063,157 B1 | 7/2021 | Cheng et al. |
| 2006/0040457 A1* | 2/2006 | Lee ........................ H01L 21/022 257/E21.018 |
| 2012/0211865 A1 | 8/2012 | Tian et al. |
| 2020/0066922 A1 | 2/2020 | Cheng et al. |
| 2020/0176552 A1 | 6/2020 | Chang et al. |
| 2021/0104598 A1 | 4/2021 | Lin et al. |
| 2021/0202761 A1 | 7/2021 | Cheng et al. |

* cited by examiner

*Primary Examiner* — Jose R Diaz
(74) *Attorney, Agent, or Firm* — Eschweiler & Potashnik, LLC

(57) ABSTRACT

Various embodiments of the present application are directed towards an integrated chip (IC). The IC comprises a trench capacitor overlying a substrate. The trench capacitor comprises a plurality of capacitor electrode structures, a plurality of warping reduction structures, and a plurality of capacitor dielectric structures. The plurality of capacitor electrode structures, the plurality of warping reduction structures, and the plurality of capacitor dielectric structures are alternatingly stacked and define a trench segment that extends vertically into the substrate. The plurality of capacitor electrode structures comprise a metal component and a nitrogen component. The plurality of warping reduction structures comprise the metal component, the nitrogen component, and an oxygen component.

20 Claims, 14 Drawing Sheets

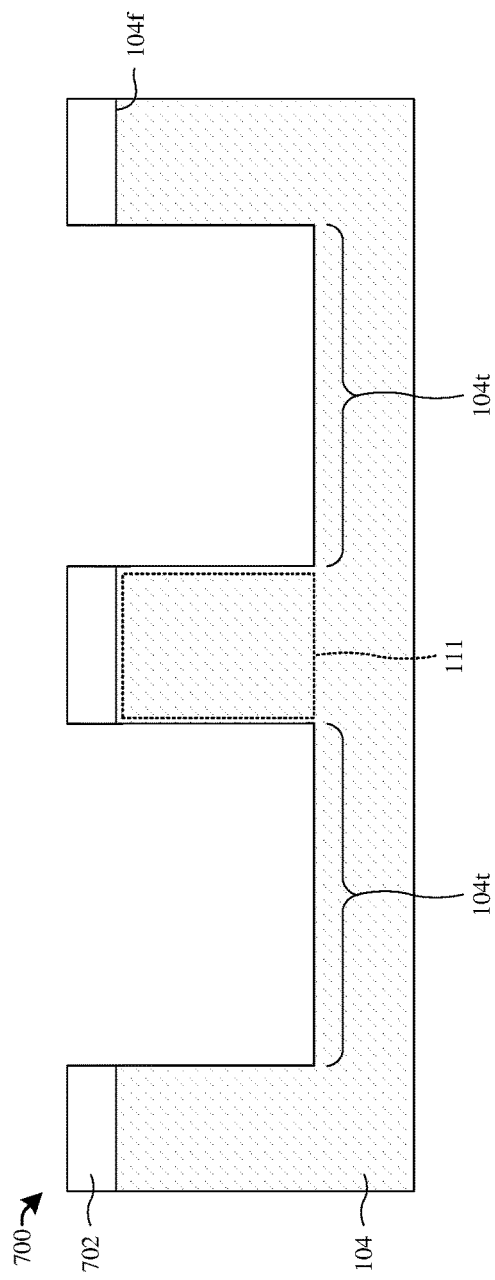
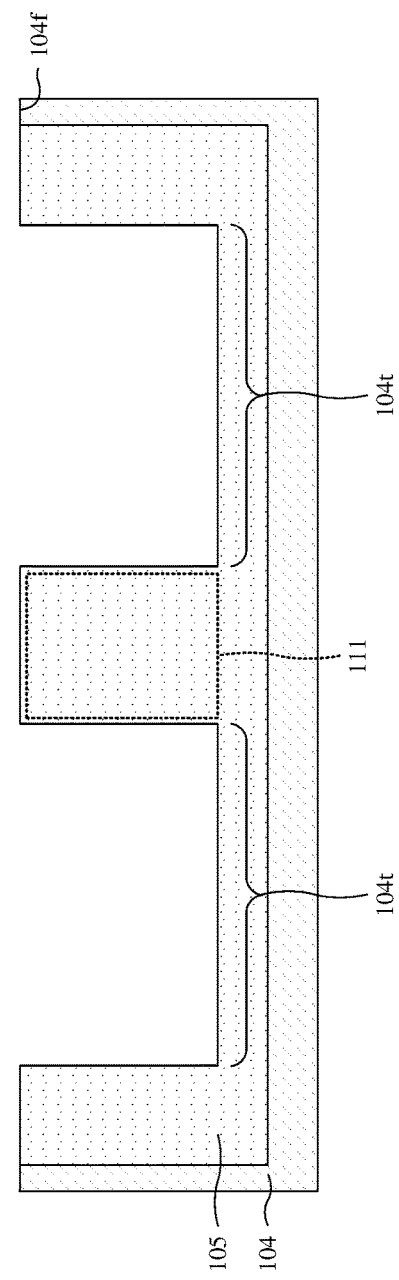
Fig. 7
Fig. 8

TRENCH CAPACITOR FILM SCHEME TO REDUCE SUBSTRATE WARPAGE

BACKGROUND

Some electronic systems (e.g., mobile phones, Internet of Things (IoT) devices, computers, etc.) often rely upon ceramic capacitors and other passive devices discretely mounted to printed circuit boards (PCBs) of the electronic systems and electrically coupled to integrated chips (ICs) of the electronic systems by the PCBs. However, this consumes large amounts of surface area on the PCBs and limits device size and/or device functionality. Further, discretely mounting and electrically coupling the passive devices increases manufacturing costs. Accordingly, next generation electronic systems are increasingly turning to integrating passive devices into an IC to reduce size, reduce cost, and increase functionality.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 7-15 illustrate a series of cross-sectional views of some embodiments of a method for forming an integrated chip (IC) comprising a trench capacitor that has a high capacitance density and causes low substrate warpage.

DETAILED DESCRIPTION

Figure 1:
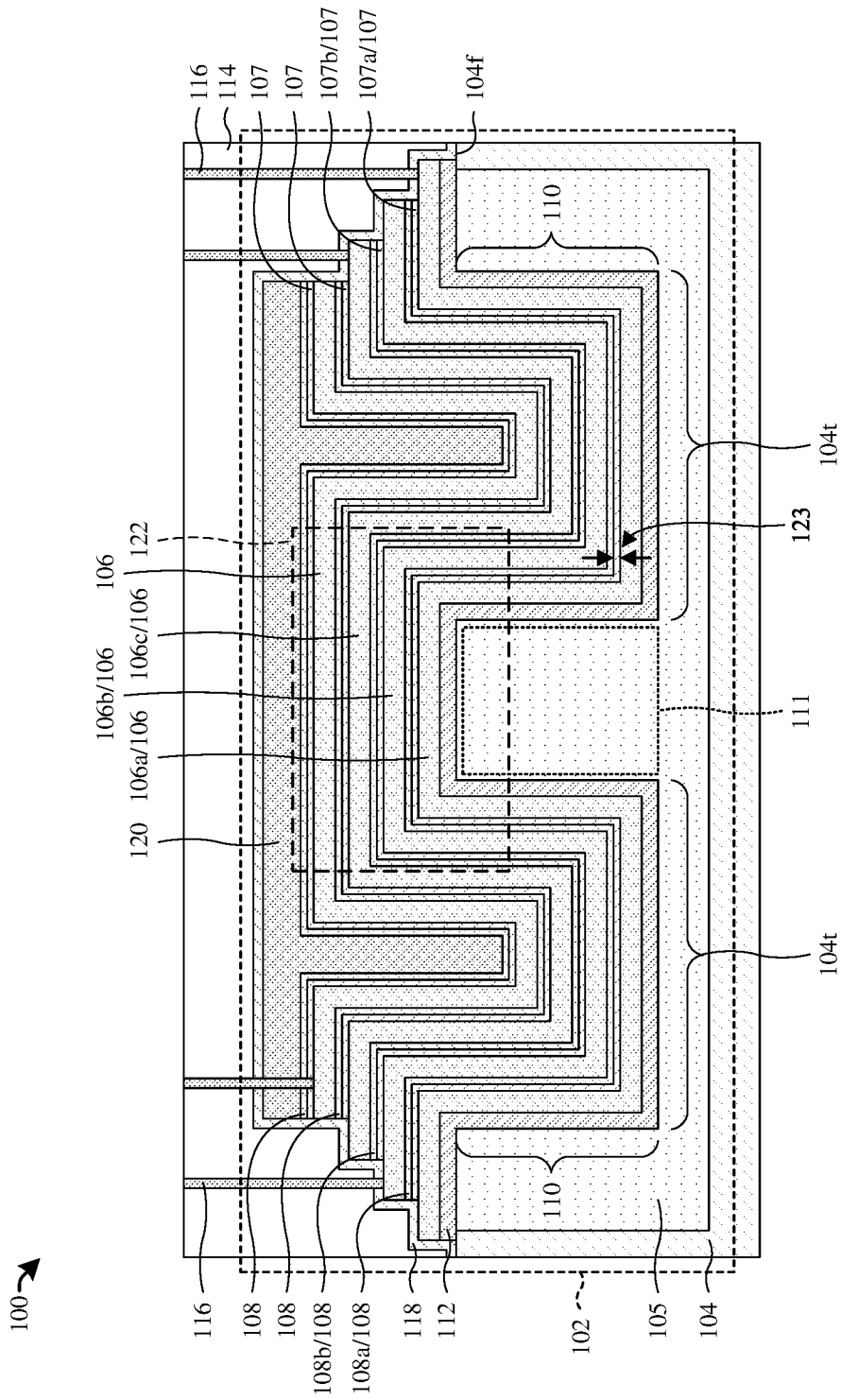
FIG. 1 illustrates a cross-sectional view of some embodiments of an integrated chip (IC) comprising a trench capacitor that has a high capacitance density and causes low substrate warpage.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some integrated chips (ICs) include a trench capacitor that is disposed within and overlies a semiconductor substrate. For example, the semiconductor substrate may include sidewalls that define one or more trenches. The trench capacitor includes a plurality of electrodes and a plurality of dielectric structures. The plurality of electrodes and the plurality of dielectric structures are alternatingly stacked in the one or more trenches.

A challenge with an IC comprising a trench capacitor is warpage of the semiconductor substrate. The trench capacitor may cause the semiconductor substrate to warp due to the trench capacitor exerting a physical stress onto the semiconductor substrate. For example, the electrodes may comprise titanium nitride (TiN) and the dielectric structures may comprise a high-k dielectric material (e.g., zirconium oxide (ZrO)). Because the electrodes comprise titanium nitride (TiN), the electrodes may be tensile films (e.g., a film having a tensile film stress—a film having a tensile film stress causes a change in a radius of curvature of a surface of an underlying substrate (after formation of the film on the surface of the underlying substrate) so that the surface of the underlying substrate adjusts to have a concave geometry). Further, because the dielectric structures comprise the high-k dielectric material, the dielectric structures may also be tensile films. As a result, the trench capacitor exerts a relatively large physical stress onto the semiconductor substrate, which may cause the semiconductor substrate to warp.

In addition, trench capacitor performance may be improved by increasing the number of electrodes and dielectric structures that the trench capacitor comprises (e.g., a capacitance density of the trench capacitor may be increased due to a greater number of electrodes and dielectric structures increasing the number of parallel plate capacitors per unit area). However, as the number of electrodes and dielectric structures increases, issues due to semiconductor substrate warpage (e.g., device failure due to cracking, delamination, etc.) are expected to become even more prominent. More specifically, as the number of electrodes and dielectric structures increases, the physical stress that the trench capacitor exerts onto the semiconductor substrate may also increase, thereby potentially exacerbating warping of the semiconductor substrate.

Various embodiments of the present application are directed toward a trench capacitor (e.g., a deep trench capacitor) that has a high capacitance density and causes low substrate warpage. In some embodiments, the trench capacitor overlies a semiconductor substrate and is disposed within a trench defined by the semiconductor substrate. The trench capacitor comprises a plurality of capacitor electrode structures, a plurality of warping reduction structures, and a plurality of capacitor dielectric structures disposed in the trench. The plurality of capacitor electrode structures, the plurality of warping reduction structures, and the plurality of capacitor dielectric structures are alternatingly stacked. The plurality of capacitor electrode structures comprise a metal component and a nitrogen component (e.g., the plurality of capacitor electrode structures comprise titanium nitride (TiN)). The plurality of warping reduction structures comprise the metal component, the nitrogen component, and an oxygen component (e.g., the plurality of warping reduction structures comprise titanium oxynitride ($TiN_yO_x$)).

Because the trench capacitor comprises the plurality of warping reduction structures, the trench capacitor may cause the semiconductor substrate to warp less than a typical trench capacitor (e.g., a trench capacitor not comprising the warping reduction structures). For example, because the plurality of warping reduction structures comprise the metal component, the nitrogen component, and the oxygen component, the plurality of warping reduction structures are compressive films (e.g., a film having a compressive film stress—a film having a compressive film stress causes a change in a radius of curvature of a surface of an underlying substrate (after formation of the film on the surface of the underlying substrate) so that the surface of the underlying substrate adjusts to have a convex geometry). In some embodiments, the plurality of warping reduction structures may be compressive films due to the plurality of warping reduction structures comprising the oxygen component (e.g., if the plurality of warping reduction structures did not comprise the oxygen component, the plurality of warping reduction structures would be tensile films). In further embodiments, the plurality of warping reduction structures may be compressive films due to, at least partially, the process in which the plurality of warping reduction structures are formed (e.g., if the plurality of warping reduction structures are not formed by a specific formation process (e.g., sputtering), the plurality of warping reduction structures would be tensile films).

Accordingly, the plurality of warping reduction structures exert a physical stress onto the plurality of capacitor electrode structures and/or the plurality of capacitor electrode structures. Thus, the physical stress exerted by the plurality of warping reduction structures may reduce the physical stress that the plurality of capacitor electrode structures and/or the plurality of capacitor dielectric structures exert onto the semiconductor substrate (e.g., the compressive film stresses of the plurality of warping reduction structures counteract the tensile film stresses of the plurality of capacitor dielectric/electrode structures). Accordingly, due to the trench capacitor comprising the plurality of warping reduction structures, the trench capacitor may have a high capacitance density and cause low substrate warpage (e.g., in comparison to a typical trench capacitor, the trench capacitor of the present disclosure may comprise more capacitor electrode structures and more dielectric electrode structures while exerting a lower physical stress onto the semiconductor substrate).

FIG. 1 illustrates a cross-sectional view of some embodiments of an integrated chip (IC) comprising a trench capacitor 102 that has a high capacitance density and causes low substrate warpage.

As shown in the cross-sectional view 100 of FIG. 1, the IC comprises a trench capacitor 102 (e.g., a deep trench capacitor (DTC)). The trench capacitor 102 overlies a substrate 104 (e.g., semiconductor substrate) and fills a plurality of trenches 104t defined by the substrate 104. The plurality of trenches 104t are defined by sidewalls of the substrate 104. The substrate 104 may comprise any type of semiconductor body (e.g., monocrystalline silicon/CMOS bulk, germanium (Ge), a group III-V semiconductor material, silicon-germanium (SiGe), silicon on insulator (SOI), etc.).

In some embodiments, a doped region 105 is disposed in the substrate 104. The doped region 105 is a region of the substrate 104 having a first doping type (e.g., p-type or n-type). In further embodiments, the doped region 105 has a different doping profile than surrounding regions of the substrate 104. For example, the doped region 105 may have the first doping type, and the surrounding regions of the substrate 104 may have a second doping type (e.g., n-type or p-type) that is opposite the first doping type. As another example, the doped region 105 and the surrounding regions of the substrate 104 may both have the first doping type, but the doped region 105 may have a higher doping concentration than the surrounding regions of the substrate 104.

The trench capacitor 102 comprises a plurality of capacitor electrode structures 106, a plurality of warping reduction structures 107, and a plurality of capacitor dielectric structures 108. The capacitor electrode structures 106, the warping reduction structures 107, and the capacitor dielectric structures 108 are alternatingly stacked, such that each of the capacitor electrode structures 106 is spaced from a neighboring one of the capacitor electrode structures 106 by a corresponding one of the warping reduction structures 107 and by a corresponding one of the capacitor dielectric structures 108 and such that the corresponding one of the warping reduction structures 107 is disposed between its corresponding one of the capacitor electrode structures 106 and the one of the capacitor dielectric structures 108 that corresponds to its corresponding one of the capacitor electrode structures 106.

For example, the plurality of capacitor electrode structures 106 comprises a first capacitor electrode structure 106a and a second capacitor electrode structure 106b. The plurality of warping reduction structures 107 comprises a first warping reduction structure 107a and a second warping reduction structure 107b. The plurality of capacitor dielectric structures 108 comprises a first capacitor dielectric structure 108a and a second capacitor dielectric structure 108b. The first warping reduction structure 107a is disposed over the first capacitor electrode structure 106a. The first capacitor dielectric structure 108a is disposed over the first warping reduction structure 107a. The first warping reduction structure 107a is disposed between (e.g., vertically between) the first capacitor dielectric structure 108a and the first capacitor electrode structure 106a. The second capacitor electrode structure 106b is disposed over the first capacitor dielectric structure 108a. The first capacitor electrode structure 106a is spaced from the second capacitor electrode structure 106b. The first capacitor electrode structure 106a neighbors the second capacitor electrode structure 106b. In other words, the first capacitor electrode structure 106a is spaced from the second capacitor electrode structure 106b (which it neighbors) by the first warping reduction structure 107a (which corresponds to the first capacitor electrode structure 106a) and the first capacitor dielectric structure 108a (which also corresponds to the first capacitor electrode structure 106a), and the first warping reduction structure 107a is disposed between the first capacitor electrode structure 106a (which the first warping reduction structure 107a corresponds to) and the first capacitor dielectric structure 108a.

Likewise, the second warping reduction structure 107b is disposed over the second capacitor electrode structure 106b. The second capacitor dielectric structure 108b is disposed over the second warping reduction structure 107b. The second warping reduction structure 107b is disposed between (e.g., vertically between) the second capacitor dielectric structure 108b and the second capacitor electrode structure 106b. In other words, the second capacitor electrode structure 106b is spaced from a third capacitor electrode structure 106c (which overlies and neighbors the second capacitor electrode structure 106b) by the second warping reduction structure 107b (which corresponds to the second capacitor electrode structure 106b) and the second capacitor dielectric structure 108b (which also corresponds to the second capacitor electrode structure 106b), and the second warping reduction structure 107b is disposed between the second capacitor electrode structure 106b (which the second warping reduction structure 107b corresponds to) and the second capacitor dielectric structure 108b. In some embodiments, the capacitor electrode structures 106, the warping reduction structures 107, and the capacitor dielectric structures 108 decrease in width from a bottom of the trench capacitor 102 to a top of the trench capacitor 102. In further embodiments, the trench capacitor 102 may have a stepped profile on opposite sides of the trench capacitor 102, as shown in the cross-sectional view 100 of FIG. 1.

The trench capacitor 102 overlies the substrate 104 and has trench segments 110 that fill the trenches 104t. The capacitor electrode structures 106, the warping reduction structures 107, and the capacitor dielectric structures 108 define the trench segments 110 of the trench capacitor 102. For example, portions of the capacitor electrode structures 106, the warping reduction structures 107, and the capacitor dielectric structures 108 disposed in a first one of the trenches 104t define a first one of the trench segments 110, and portions of the capacitor electrode structures 106, the warping reduction structures 107, and the capacitor dielectric structures 108 disposed in a second one of the trenches 104t define a second one of the trench segments 110. The trench segments 110 may be disposed within the doped region 105. In some embodiments, the doped region 105 is configured to electrically isolate the trench capacitor 102 from other devices disposed within and/or on the substrate 104.

The substrate 104 comprises a pillar structure 111 that is disposed laterally between the trenches 104t of the substrate 104 (and laterally between the trench segments 110 of the trench capacitor 102). In some embodiments, a dielectric liner structure 112 is disposed between the trench capacitor 102 and the substrate 104. The dielectric liner structure 112 may extend along (e.g., line) a first surface 104f (e.g., front-side surface) of the substrate 104 and along surfaces (e.g., sidewalls, lower surfaces, etc.) of the substrate 104 that define the trenches 104t and the pillar structure 111. The first surface 104f of the substrate 104 is opposite a second surface (e.g., back-side surface) of the substrate 104. In other embodiments, the dielectric liner structure 112 is omitted. In such embodiments, the first capacitor electrode structure 106a may extend along the first surface 104f (e.g., front-side surface) of the substrate 104 and along the surfaces of the substrate 104 that define the trenches 104t and the pillar structure 111. In further embodiments, the dielectric liner structure 112 may be or comprise, for example, an oxide (e.g., SiO$_2$), a nitride (e.g., silicon nitride (SiN)), a semiconductor-based oxynitride (e.g., silicon oxynitride (SiON)), or the like.

An interlayer dielectric (ILD) structure 114 is disposed over the substrate 104 and the trench capacitor 102. In some embodiments, the ILD structure 114 comprises one or more stacked ILD layers, which may respectively comprise a low-k dielectric (e.g., a dielectric material with a dielectric constant less than about 3.9), an oxide (e.g., silicon dioxide (SiO$_2$)), or the like. A plurality of conductive contacts 116 (e.g., metal contacts) are disposed in the ILD structure 114 and over the trench capacitor 102. The plurality of conductive contacts 116 are electrically coupled to and extend from the plurality of capacitor electrode structures 106, respectively. In some embodiments, the plurality of conductive contacts 116 comprises, for example, tungsten (W), copper (Cu), aluminum (Al), some other conductive material, or a combination of the foregoing. It will be appreciated that the plurality of conductive contacts 116 may be part of an interconnect structure (e.g., copper interconnect structure) that is disposed in the ILD structure 114 and over both the substrate 104 and the trench capacitor 102.

In some embodiments, an etch stop layer 118 is disposed along upper surfaces and along sidewalls of the trench capacitor 102. In other embodiments, the etch stop layer 118 may be omitted. In further embodiments, the etch stop layer 118 may be or comprise, for example, an oxide (e.g., SiO$_2$), a nitride (e.g., SiN), a semiconductor-based oxynitride (e.g., SiON), a carbide (e.g., silicon carbide (SiC)), or the like.

In some embodiments, a capping dielectric structure 120 is disposed between the ILD structure 114 and the trench capacitor 102. In further embodiments, the capping dielectric structure 120 is disposed between the etch stop layer 118 and the trench capacitor 102. In further embodiments, the capping dielectric structure 120 may have a lower surface (e.g., a lowermost surface) disposed below a lower surface of the first capacitor electrode structure 106a. In further embodiments, the capping dielectric structure 120 may be or comprise, for example, an oxide (e.g., SiO$_2$), a nitride (e.g., SiN), a semiconductor-based oxynitride (e.g., SiON), a low-k dielectric (e.g., a dielectric material with a dielectric constant less than about 3.9), some other dielectric material, or a combination of the foregoing.

The capacitor electrode structures 106 are stacked over the substrate 104. In some embodiments, the capacitor electrode structures 106 are conformal structures. In some embodiments, the capacitor electrode structures 106 are or comprise a metal nitride, such as titanium nitride (TiN), tantalum nitride (TaN), or the like. In such embodiments, the capacitor electrode structures 106 comprise a metal component (e.g., titanium (Ti) atoms) and a nitrogen component (e.g., nitrogen (N) atoms).

In some embodiments, the capacitor electrode structures 106 are tensile films, respectively. In some embodiments, a tensile film is a film that causes a change in a radius of curvature of a surface of a substrate after the film has been formed on the surface of the substrate, such that the surface of the substrate adjusts to have a concave geometry after the film has been formed on the surface of the substrate. For example, by forming the first capacitor electrode structure 106a (or any other one of the capacitor electrode structures 106) on a surface of a substrate, the first capacitor electrode structure 106a will cause a change in a radius of curvature of the surface of the substrate such that the surface of the substrate adjusts to have a concave geometry (or a more concave geometry). In further embodiments, the capacitor electrode structures 106 may be tensile films due to the capacitor electrode structures 106 having more tensile stress states than compressive stress states (e.g., the capacitor electrode structures 106 are under tensile stress).

The capacitor dielectric structures 108 are disposed between the capacitor electrode structures 106. The capacitor dielectric structures 108 are configured to electrically insulate the capacitor electrode structures 106 from one another. For example, the first capacitor dielectric structure 108a is disposed between the first capacitor electrode structure 106a and the second capacitor electrode structure 106b and electrically insulates the first capacitor electrode structure 106a from the second capacitor electrode structure 106b, the second capacitor dielectric structure 108b is disposed between the second capacitor electrode structure 106b and the third capacitor electrode structure 106c and electrically insulates the second capacitor electrode structure 106b from the third capacitor electrode structure 106c, and so forth. In some embodiments, the capacitor dielectric structures 108 are conformal structures.

In some embodiments, the capacitor dielectric structures 108 may be or comprise, for example, a high-k dielectric material, or some other suitable dielectric material(s). The high-k dielectric material may be or comprise, for example, hafnium oxide (HfO), zirconium oxide (ZrO), aluminum oxide (AlO), some other dielectric material with a dielectric constant greater than about 3.9, or a combination of the foregoing. In yet further embodiments, the capacitor dielectric structures 108 may be multi-layer dielectric structures (e.g., comprising a high-k dielectric layer and a base dielectric layer that are different dielectric materials).

In some embodiments, the capacitor dielectric structures 108 are tensile films, respectively. For example, by forming the first capacitor dielectric structure 108a (or any other one of the capacitor dielectric structures 108) on a surface of a substrate, the first capacitor dielectric structure 108a will cause a change in a radius of curvature of the surface of the substrate such that the surface of the substrate adjusts to have a concave geometry (or a more concave geometry). In further embodiments, the capacitor dielectric structures 108 may be tensile films due to the capacitor dielectric structures 108 having more tensile stress states than compressive stress states (e.g., the capacitor dielectric structures 108 are under tensile stress).

Each of the warping reduction structures 107 are disposed between a corresponding one of the capacitor dielectric structures 108 and a corresponding one of the capacitor electrode structures 106. For example, the first warping reduction structure 107a is disposed between the first capacitor electrode structure 106a and the first capacitor dielectric structure 108a, the second warping reduction structure 107b is disposed between the second capacitor electrode structure 106b and the second capacitor dielectric structure 108b, and so forth. In some embodiments, each of the warping reduction structures 107 contacts (e.g., directly contacts) a corresponding one of the capacitor electrode structures 106. For example, the first warping reduction structure 107a contacts (e.g., directly contacts) the first capacitor electrode structure 106a, the second warping reduction structure 107b contacts (e.g., directly contacts) the second capacitor electrode structure 106b, and so forth. In some embodiments, each of the warping reduction structures 107 contacts (e.g., directly contacts) a corresponding one of the capacitor dielectric structures 108. For example, the first warping reduction structure 107a contacts (e.g., directly contacts) the first capacitor dielectric structure 108a, the second warping reduction structure 107b contacts (e.g., directly contacts) the second capacitor dielectric structure 108b, and so forth. In some embodiments, each of the capacitor dielectric structures 108 contacts (e.g., directly contacts) a corresponding one of the capacitor electrode structures 106 and a corresponding one of the warping reduction structures 107. For example, the first capacitor dielectric structure 108a contacts (e.g., directly contacts) the second capacitor electrode structure 106b and contacts (e.g., directly contacts) the first warping reduction structure 107a.

In some embodiments, the warping reduction structures 107 may have substantially the same width (e.g., substantially the same width includes small process variations caused by the fabrication process) as their corresponding one of the capacitor dielectric structures 108. For example, the first warping reduction structure 107a may have substantially the same width (e.g., lateral distance between opposite outermost sidewalls) as the first capacitor dielectric structure 108a, as shown in the cross-sectional view 100 of FIG. 1. In further embodiments, opposite outer sidewalls of the warping reduction structures 107 may be substantially aligned with opposite outermost sidewall of their corresponding one of the capacitor dielectric structures 108. For example, the first warping reduction structure 107a may have opposite outer sidewalls that are substantially aligned with opposite outer sidewalls of the first capacitor dielectric structure 108a, as shown in the cross-sectional view 100 of FIG. 1. In further embodiments, the warping reduction structures 107 may have substantially the same width as an overlying (e.g., directly overlying) one of the capacitor electrode structures 106. For example, the first warping reduction structure 107a may have substantially the same width as the second capacitor electrode structure 106b, as shown in the cross-sectional view 100 of FIG. 1. In further embodiments, the opposite outer sidewalls of the warping reduction structures 107 may be substantially aligned with opposite outermost sidewall of an overlying one of the capacitor electrode structures 106. For example, the opposite outer sidewalls of the first warping reduction structure 107a may be substantially aligned with opposite outer sidewalls of the second capacitor electrode structure 106b, as shown in the cross-sectional view 100 of FIG. 1.

The warping reduction structures 107 comprise the metal component of the capacitor electrode structures 106, the nitrogen component of the capacitor electrode structures 106, and an oxygen component (e.g., oxygen (O) atoms). In further embodiments, the warping reduction structures 107 are or comprise a metal oxynitride, for example, titanium oxynitride ($TiN_yO_x$), tantalum oxynitride ($TaN_yO_x$), or the like. For example, in some embodiments, the capacitor electrode structures 106 are titanium nitride (TiN) and the warping reduction structures 107 are titanium oxynitride ($TiN_yO_x$). In some embodiments, the capacitor electrode structures 106 have a first chemical composition (e.g., TaN) and the warping reduction structures 107 have a second chemical composition (e.g., $TaN_yO_x$) that is different than the first chemical composition. In some embodiments, the warping reduction structures 107 have a thickness 123. For example, in some embodiments, the first warping reduction structure 107a has the thickness 123, the second warping reduction structure 107b has the thickness 123, and so forth. In some embodiments, the thickness 123 is between about 10 angstroms (Å) and about 1000 Å. In further embodiments, the thickness 123 is between about 25 Å and about 65 Å.

In some embodiments, the warping reduction structures 107 are electrically conductive. In such embodiments, the trench capacitor 102 may have a higher capacitor density than if the warping reduction structures 107 were electrically insulating. For example, if the warping reduction structures 107 have an electrical conductivity greater than an insulator, the trench capacitor 102 may have a higher capacitor density than if the warping reduction structures 107 were an insulator (e.g., if the warping reduction structures 107 were a dielectric material, such as $SiO_2$, SiN, etc.).

In some embodiments, the first capacitor electrode structure 106a is disposed nearer the substrate 104 than any other of the capacitor electrode structures 106. In some embodiments, the first warping reduction structure 107a is disposed nearer the substrate 104 than any other of the warping reduction structures 107. In some embodiments, the first capacitor dielectric structure 108a is disposed nearer the substrate 104 than any other of the capacitor dielectric structures 108.

In some embodiments, the first capacitor electrode structure 106a overlies and lines the dielectric liner structure 112. In some embodiments, the first warping reduction structure 107a overlies and lines the first capacitor electrode structure 106a. In some embodiments, the first capacitor dielectric structure 108a overlies and lines the first warping reduction structure 107a. In some embodiments, the second capacitor electrode structure 106b overlies and lines the first capacitor dielectric structure 108a.

In some embodiments, the warping reduction structures 107 are compressive films, respectively. A compressive film is a film that causes a change in a radius of curvature of a surface of a substrate after the film has been formed on the surface of the substrate, such that the surface of the substrate adjusts to have a convex geometry after the film has been formed on the surface of the substrate. For example, by forming the first warping reduction structure 107a (or any other one of the warping reduction structures 107) on a surface of a substrate, the first warping reduction structure 107a will cause a change in a radius of curvature of the surface of the substrate such that the surface of the substrate adjusts to have a convex geometry (or a more convex geometry). In further embodiments, the warping reduction structures 107 may be compressive films due to the warping reduction structures 107 having more compressive stress states than tensile stress states (e.g., the warping reduction structures 107 are under compressive stress). In some embodiments, the warping reduction structures 107 are compressive films due to the warping reduction structures 107 comprising the metal component, the nitrogen component, and the oxygen component (e.g., if the warping reduction structures 107 did not comprise the oxygen component, the warping reduction structures 107 would be tensile films). For example, the oxygen component may alter bonds (e.g., chemical bonds) in the warping reduction structures 107, thereby causing each of the warping reduction structures 107 to be a compressive film.

Because the trench capacitor 102 comprises the warping reduction structures 107, the substrate 104 may warp less than if a typical trench capacitor (e.g., a trench capacitor not comprising the warping reduction structures) was disposed on/over the substrate 104. In other words, because the trench capacitor 102 comprises the warping reduction structures 107, the trench capacitor 102 may cause the substrate 104 to warp less than the typical trench capacitor would. For example, because the warping reduction structures 107 are compressive films, the warping reduction structures 107 exert physical stresses onto the capacitor electrode structures 106 and/or the capacitor dielectric structures 108. These physical stresses exerted by the warping reduction structures 107 may reduce the physical stresses that the capacitor electrode structures 106 and/or the capacitor dielectric structures 108 exert onto the substrate 104 (e.g., the compressive film stresses of the warping reduction structures 107 counteract the tensile film stresses of the plurality of capacitor dielectric/electrode structures). Accordingly, due to the trench capacitor 102 comprising the warping reduction structures 107, the trench capacitor 102 may have a high capacitance density and cause low substrate warpage (e.g., in comparison to the typical trench capacitor, the trench capacitor 102 may comprise more capacitor electrode structures 106 and/or more capacitor dielectric structures 108 while exerting a lower physical stress onto the substrate 104).

Figure 2:
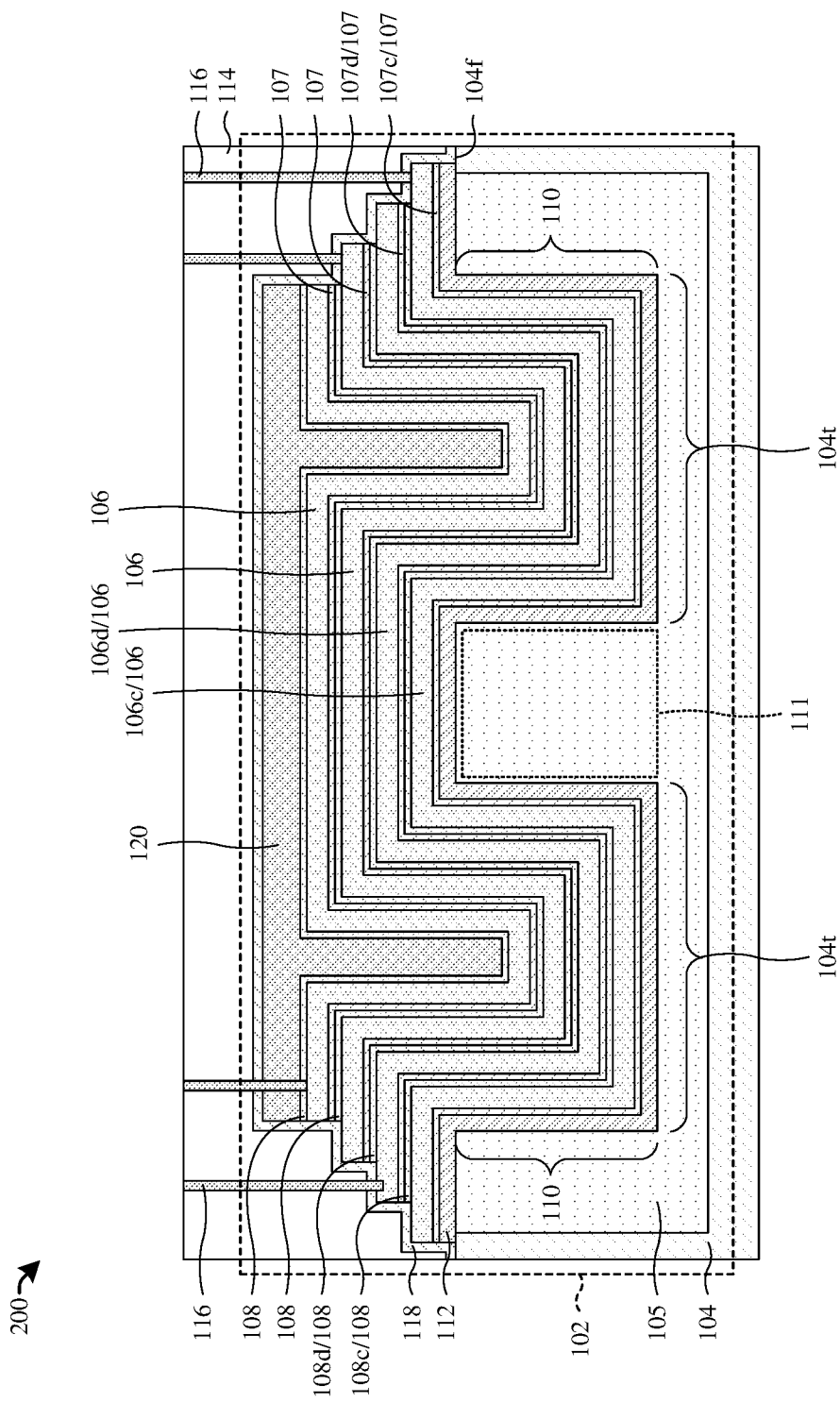
FIG. 2 illustrates a cross-sectional view of some other embodiments of the IC of FIG. 1.

FIG. 2 illustrates a cross-sectional view 200 of some other embodiments of the IC of FIG. 1.

As shown in the cross-sectional view 200 of FIG. 2, in some embodiments, the capacitor electrode structures 106, the warping reduction structures 107, and the capacitor dielectric structures 108 are alternatingly stacked, such that each of the capacitor electrode structures 106 overlies a corresponding one of the warping reduction structures 107. For example, the plurality of capacitor electrode structures 106 comprises a third capacitor electrode structure 106c and a fourth capacitor electrode structure 106d. The plurality of warping reduction structures 107 comprises a third warping reduction structure 107c and a fourth warping reduction structure 107d. The third capacitor electrode structure 106c overlies the third warping reduction structure 107c. The fourth capacitor electrode structure 106d overlies the fourth warping reduction structure 107d. The fourth warping reduction structure 107d is disposed between the third capacitor electrode structure 106c and the fourth capacitor electrode structure 106d. The third capacitor electrode structure 106c is disposed between the fourth warping reduction structure 107d and the third warping reduction structure 107c.

In some embodiments, the third warping reduction structure 107c may separate the third capacitor electrode structure 106c from the substrate 104. In some embodiments, the third warping reduction structure 107c separates the third capacitor electrode structure 106c from the dielectric liner structure 112. In further embodiments, the third warping reduction structure 107c may contact (e.g., directly contact) the third capacitor electrode structure 106c and/or the dielectric liner structure 112. In some embodiments, the third warping reduction structure 107c may have substantially the same width (e.g., laterally distance between opposite outermost sidewalls) as the third capacitor electrode structure 106c, as shown in the cross-sectional view 200 of FIG. 2. In further embodiments, the third warping reduction structure 107c may have opposite outer sidewalls that are substantially aligned with opposite outer sidewalls of the third capacitor electrode structure 106c, as shown in the cross-sectional view 200 of FIG. 2.

In further embodiments, the capacitor electrode structures 106, the warping reduction structures 107, and the capacitor dielectric structures 108 are alternatingly stacked, such that each of the capacitor dielectric structures 108 overlies a corresponding one of the capacitor electrode structures 106. For example, the plurality of capacitor dielectric structures 108 comprises a third capacitor dielectric structure 108c and a fourth capacitor dielectric structure 108d. The third capacitor dielectric structure 108c overlies the third capacitor electrode structure 106c. The fourth capacitor dielectric structure 108d overlies the fourth capacitor electrode structure 106d. The third capacitor dielectric structure 108c is disposed between the fourth warping reduction structure 107d and the third capacitor electrode structure 106c. The fourth capacitor electrode structure 106d is disposed between the third capacitor dielectric structure 108c and the fourth capacitor dielectric structure 108d.

In some embodiments, the third capacitor dielectric structure 108c may contact (e.g., directly contact) the third capacitor electrode structure 106c and/or the fourth warping reduction structure 107d. In some embodiments, the third capacitor dielectric structure 108c may have substantially the same width (e.g., laterally distance between opposite outermost sidewalls) as the fourth capacitor electrode structure 106d and/or the fourth warping reduction structure 107d, as shown in the cross-sectional view 200 of FIG. 2. In further embodiments, the third capacitor dielectric structure 108c may have opposite outer sidewalls that are substantially aligned with opposite outer sidewalls of the fourth capacitor electrode structure 106d and/or opposite outer sidewalls of the fourth warping reduction structure 107d, as shown in the cross-sectional view 200 of FIG. 2.

In some embodiments, sidewalls of the trenches 104t are substantially vertical (e.g., extending vertically in a substantially straight line), as shown in the cross-sectional view 200 of FIG. 2. In other embodiments, the sidewalls of the trenches 104t may be angled (e.g., angle in, angle out, or both). In some embodiments, lower surfaces of the trenches 104t are substantially planar, as shown in the cross-sectional view 200 of FIG. 2. In other embodiments, the lower surfaces of the trenches 104t are rounded.

While FIG. 2 (and FIG. 1) illustrates the trenches 104t comprising two (2) individual trenches, it will be appreciated that the trenches 104t may comprise any number of individual trenches (e.g., one (1) individual trench, two (2) individual trenches, three (3) individual trenches, etc.). In some embodiments, the trenches 104t may comprise seven (7) individual trenches. It will also be appreciated that the trenches 104t may be a set of trenches of a plurality of trenches that are disposed in an array (when viewed along a top view). For example, the plurality of trenches may comprise a plurality of rows and a plurality of columns of individual trenches, and the trenches 104t illustrated in FIG. 2 may be trenches disposed in an individual row (or an individual column) of the array of trenches.

Figure 3:
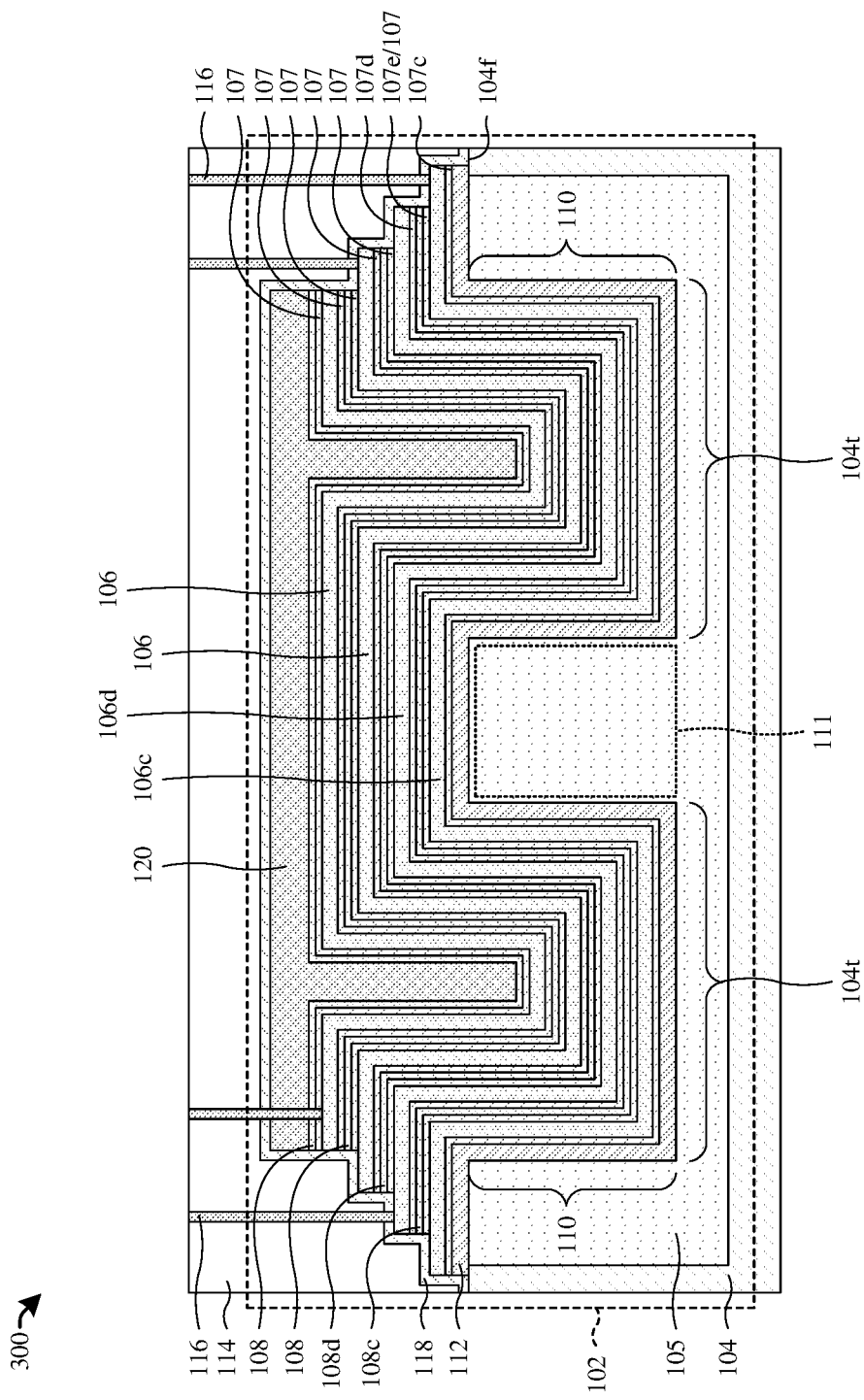
FIG. 3 illustrates a cross-sectional view of some other embodiments of the IC of FIG. 2.

FIG. 3 illustrates a cross-sectional view 300 of some other embodiments of the IC of FIG. 2.

As shown in the cross-sectional view 300 of FIG. 3, in some embodiments, the capacitor electrode structures 106, the warping reduction structures 107, and the capacitor dielectric structures 108 are alternatingly stacked, such that each of the capacitor electrode structures 106 overlies a first corresponding one of the warping reduction structures 107 and underlies a second corresponding one of the warping reduction structures 107. For example, the plurality of warping reduction structures 107 comprises the third warping reduction structure 107c, the fourth warping reduction structure 107d, and a fifth warping reduction structure 107e. The third capacitor electrode structure 106c overlies the third warping reduction structure 107c. The third capacitor electrode structure 106c underlies the fifth warping reduction structure 107e. The third capacitor electrode structure 106c also underlies the fourth warping reduction structure 107d and the third capacitor dielectric structure 108c. The third capacitor dielectric structure 108c overlies the fifth warping reduction structure 107e. The third capacitor dielectric structure 108c separates the fifth warping reduction structure 107e from the fourth warping reduction structure 107d. The fifth warping reduction structure 107e separates the third capacitor dielectric structure 108c from the third capacitor electrode structure 106c. The fourth warping reduction structure 107d separates the third capacitor dielectric structure 108c from the fourth capacitor electrode structure 106d.

In some embodiments, the third capacitor dielectric structure 108c may contact (e.g., directly contact) the fifth warping reduction structure 107e and/or the fourth warping reduction structure 107d. In some embodiments, the fifth warping reduction structure 107e may contact (e.g., directly contact) the third capacitor dielectric structure 108c and/or the third capacitor electrode structure 106c. The fourth warping reduction structure 107d may contact (e.g., directly contact) the third capacitor dielectric structure 108c and/or the fourth capacitor electrode structure 106d. In some embodiments, the fifth warping reduction structure 107e may have substantially the same width (e.g., laterally distance between opposite outermost sidewalls) as the fourth capacitor electrode structure 106d, the fourth warping reduction structure 107d, and/or the third capacitor dielectric structure 108c, as shown in the cross-sectional view 300 of FIG. 3. In further embodiments, the fifth warping reduction structure 107e may have opposite outer sidewalls that are substantially aligned with opposite outer sidewalls of the third capacitor dielectric structure 108c, opposite outer sidewalls of the fourth warping reduction structure 107d, and/or opposite outer sidewalls of the fourth capacitor electrode structure 106d, as shown in the cross-sectional view 300 of FIG. 3. In some embodiments, because each of the capacitor electrode structures 106 overlies a first corresponding one of the warping reduction structures 107 and underlies a second corresponding one of the warping reduction structures 107, the trench capacitor 102 may cause even less warping of the substrate 104 (e.g., due to the additional warping reduction structures counteracting even more of the tensile film stresses of the plurality of capacitor dielectric/electrode structures).

While it has been described herein that the capacitor electrode structures 106 and the capacitor dielectric structures 108 may be tensile films, it will be appreciated that, in other embodiments, the capacitor electrode structures 106 and the capacitor dielectric structures 108 may be compressive films. In such embodiments, the warping reduction structures 107 are then tensile films. In further such embodiments, the trench capacitor 102 may still cause the substrate 104 to warp less than the typical trench capacitor would (e.g., the tensile film stresses of the warping reduction structures 107 counteract the compressive film stresses of the plurality of capacitor dielectric/electrode structures).

Figure 4:
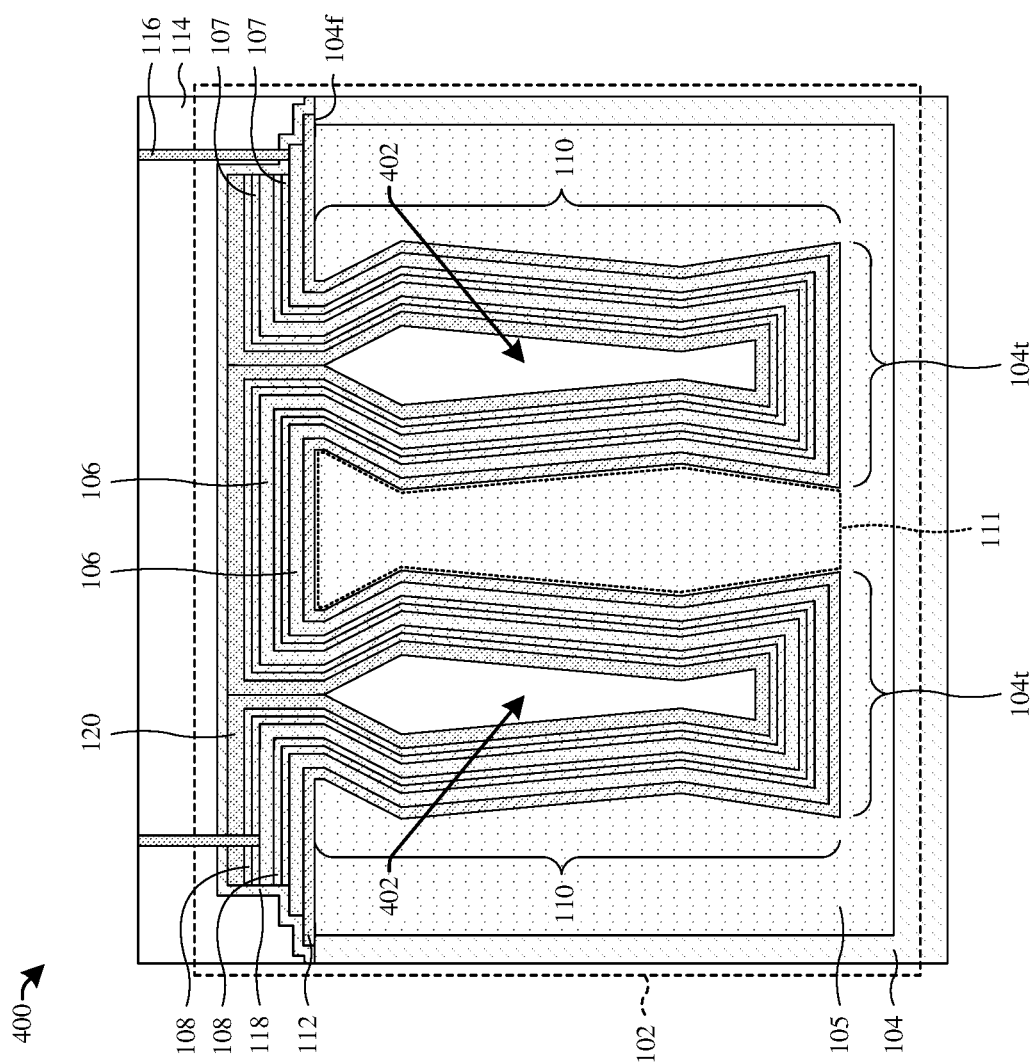
FIG. 4 illustrates a cross-sectional view of some other embodiments of the IC of FIG. 1.

FIG. 4 illustrates a cross-sectional view 400 of some other embodiments of the IC of FIG. 1.

As shown in the cross-sectional view 400 of FIG. 4, in some embodiments, cavities 402 are disposed in the trenches 104t, respectively. In some embodiments, the cavities 402 are defined by surfaces (e.g., inner sidewalls, upper surfaces, etc.) of the capping dielectric structure 120. In further embodiments, the capping dielectric structure 120 may seal the cavities 402, such that the cavities 402 are sealed (e.g., hermetically sealed) at a predefined pressure. The cavities 402 may be configured to further reduce the amount the trench capacitor 102 warps the substrate 104. For example, the cavities 402 may reduce substrate warpage due to the cavities 402 providing a space in which the capacitor electrode structures 106, the warping reduction structures 107, and/or the capacitor dielectric structures 108 may expand while undergoing thermal expansion, thereby further mitigating warpage of the substrate 104.

In some embodiments, the cavities 402 may mitigate warpage of the substrate 104 due to a shape of the cavities 402. For example, as shown in the cross-sectional view 400 of FIG. 4, a first cavity of the cavities 402 has an upper point. A width of the first cavity increases from the upper point to a first midpoint of the first cavity. A width of the first cavity decreases from the first midpoint to a second midpoint of the first cavity. The first midpoint is disposed vertically between the second midpoint and the upper point of the first cavity. A width of the first cavity increases from the second midpoint to a lower point of the first cavity. In some embodiments, each of the cavities 402 have a same shape. In some embodiments, the cavities 402 may mitigate warpage of the substrate 104 due to, at least partially, the cavities 402 having the shape described herein (e.g., the shape of the first cavity described herein). Since the warping reduction structures 107 line the trenches 104*t*, it will be appreciated that the warping reduction structures 107 may have sidewalls that correspond to a shape of the cavities 402, as shown in the cross-sectional view 400 of FIG. 4.

Figure 5:
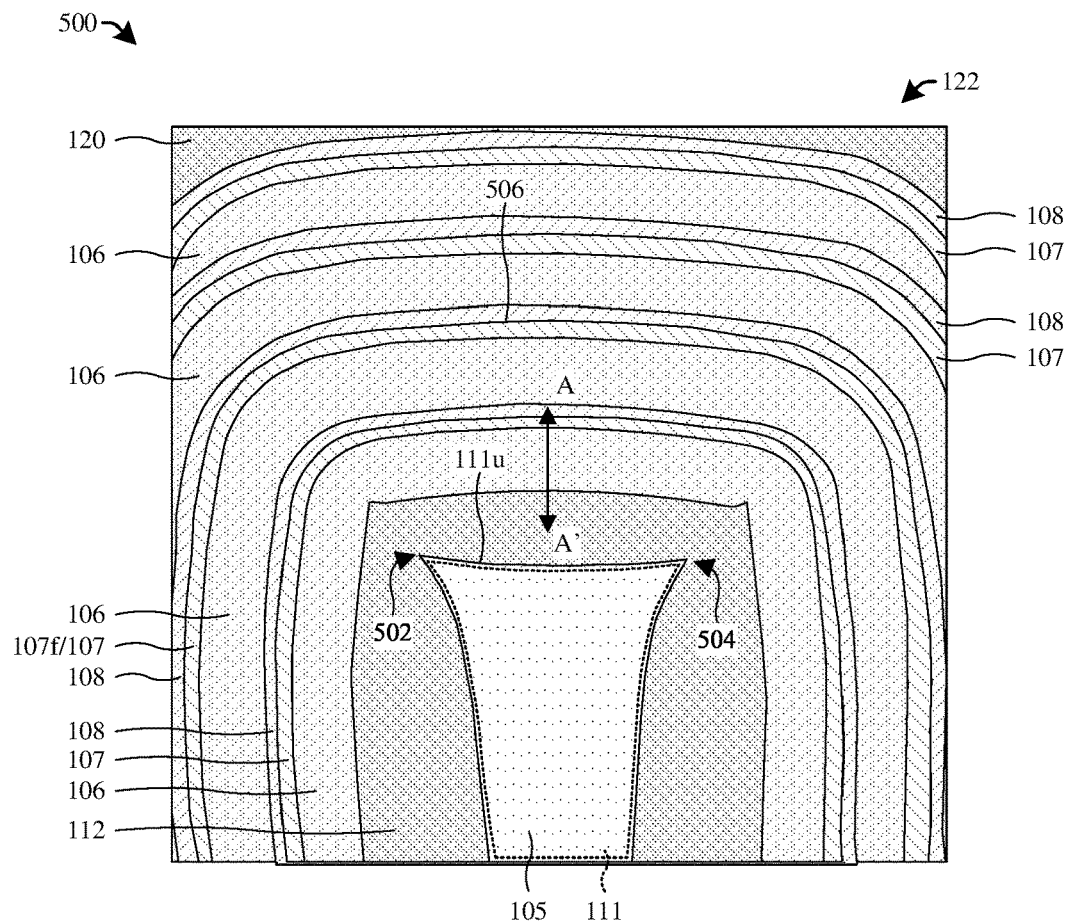
FIG. 5 illustrates a cross-sectional view of some other embodiments of an area of the IC of FIG. 1.

FIG. 5 illustrates a cross-sectional view 500 of some other embodiments of an area 122 of the IC of FIG. 1.

As shown in the cross-sectional view 500 of FIG. 5, the pillar structure 111 has an upper surface 111*u*. The upper surface 111*u* of the pillar structure 111 extends laterally between a first outer point 502 of the pillar structure 111 and a second outer point 504 of the pillar structure 111. The first outer point 502 of the pillar structure 111 is opposite the second outer point 504 of the pillar structure 111. In some embodiments, the upper surface 111*u* of the pillar structure 111 is rounded, as shown in the cross-sectional view 500 of FIG. 5. In some embodiments, the rounded upper surface 111*u* of the pillar structure 111 is concave, as shown in the cross-sectional view 500 of FIG. 5. In other embodiments, the upper surface 111*u* of the pillar structure 111 may be substantially planar.

Also shown in the cross-sectional view 500 of FIG. 5, the warping reduction structures 107 comprise a sixth warping reduction structure 107*f*. The sixth warping reduction structure 107*f* has an upper surface 506. In some embodiments, the upper surface 506 of the sixth warping reduction structure 107*f* is rounded, as shown in the cross-sectional view 500 of FIG. 5. In further embodiments, the rounded upper surface 506 of the sixth warping reduction structure 107*f* continuously arcs from beyond the first outer point 502 of the pillar structure 111 (e.g., from a left side of the first outer point 502) to beyond the second outer point 504 of the pillar structure 111 (e.g., to a right side of the first outer point 502). In yet further embodiments, the rounded upper surface 506 of the sixth warping reduction structure 107*f* is convex, as shown in the cross-sectional view 500 of FIG. 5. In other embodiments, the upper surface 506 of the sixth warping reduction structure 107*f* may be substantially planar. In some embodiments, each of the warping reduction structures 107 has an upper surface that continuously arcs from beyond the first outer point 502 of the pillar structure 111 to beyond the second outer point 504 of the pillar structure 111.

Figure 6:
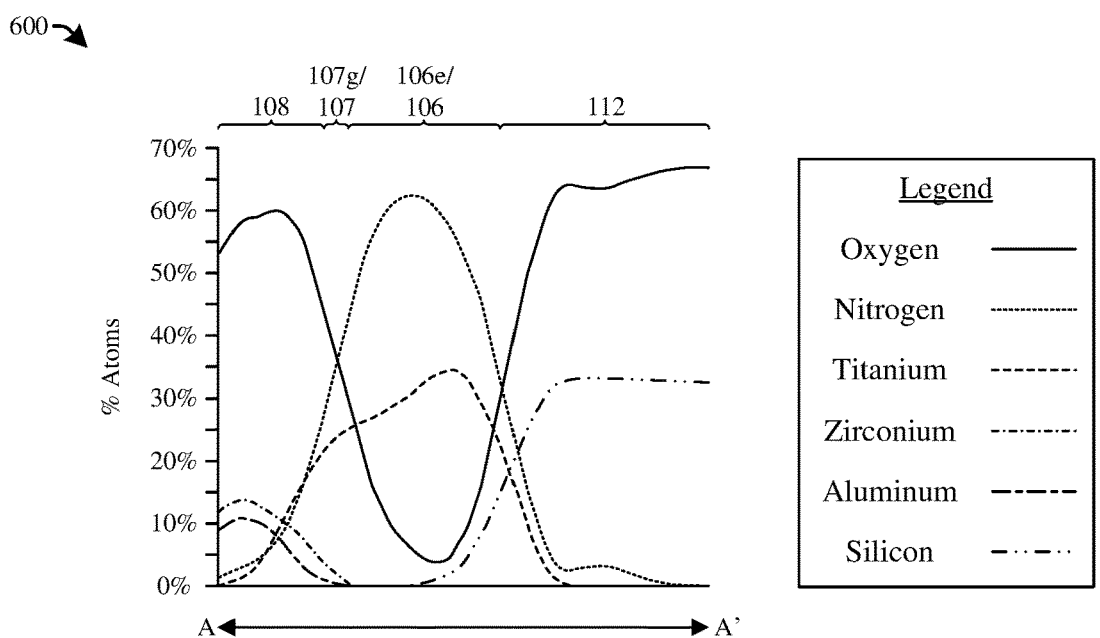
FIG. 6 illustrates some embodiments of an energy-dispersive detector (EDS) graph of some embodiments of the trench capacitor of FIG. 5.

FIG. 6 illustrates some embodiments of an energy-dispersive detector (EDS) graph 600 of some embodiments of the trench capacitor 102 of FIG. 5. The data illustrated in the EDS graph 600 of FIG. 6 refers to data taken along line A-A' of FIG. 5.

As shown in the EDS graph 600 of FIG. 6, a seventh warping reduction structure 107*g* of the warping reduction structures 107 comprises a metal component, a nitrogen component, and an oxygen component. The metal component comprises a plurality of metal atoms (e.g., titanium atoms, tantalum atoms, etc.). In some embodiments, the plurality of metal atoms are a plurality of titanium (Ti) atoms, as shown in the EDS graph 600 of FIG. 6. The oxygen component comprises a plurality of oxygen (O) atoms. The nitrogen component comprises a plurality of nitrogen (N) atoms.

In some embodiments, the seventh warping reduction structure 107*g* comprises at least twenty percent (20%) oxygen atoms. In other words, the plurality of oxygen (O) atoms accounts for at least twenty percent (20%) of the overall composition of atoms of the seventh warping reduction structure 107*g*. In some embodiments, if the seventh warping reduction structure 107*g* comprises less than twenty percent (20%) oxygen atoms, the seventh warping reduction structure 107*g* (and thus the other warping reduction structures 107 as well) may be a compressive film (or less of a tensile film). Accordingly, in some embodiments, if the seventh warping reduction structure 107*g* comprises less than twenty percent (20%) oxygen atoms, the warping reduction structures 107 may be less likely to reduce the physical stresses that the capacitor electrode structures 106 and/or the capacitor dielectric structures 108 exert onto the substrate 104, thereby limiting the ability of the warping reduction structures 107 to reduce warpage of the substrate 104.

In some embodiments, the seventh warping reduction structure 107*g* comprises at least thirty percent (30%) oxygen atoms. In other words, the plurality of oxygen (O) atoms accounts for at least thirty percent (30%) of the overall composition of atoms of the seventh warping reduction structure 107*g*. In some embodiments, if the seventh warping reduction structure 107*g* comprises less than thirty percent (30%) oxygen atoms, the seventh warping reduction structure 107*g* (and thus the other warping reduction structures 107 as well) may be a compressive film (or less of a tensile film). Accordingly, in some embodiments, if the seventh warping reduction structure 107*g* comprises less than thirty percent (30%) oxygen atoms, the warping reduction structures 107 may be less likely to reduce the physical stresses that the capacitor electrode structures 106 and/or the capacitor dielectric structures 108 exert onto the substrate 104, thereby limiting the ability of the warping reduction structures 107 to reduce warpage of the substrate 104.

Also shown in the EDS graph 600 of FIG. 6, a fifth capacitor electrode structure 106*e* of the capacitor electrode structures 106 comprises the metal component (e.g., titanium (Ti) atoms) and the nitrogen component (e.g., nitrogen (N) atoms). In some embodiments, the fifth capacitor electrode structure 106*e* (and thus the other capacitor electrode structures 106 as well) may also comprise the oxygen component (e.g., oxygen (O) atoms). However, in embodiments in which the fifth capacitor electrode structure 106*e* (and the capacitor electrode structures 106) comprises the oxygen component, the fifth capacitor electrode structure 106*e* (and the capacitor electrode structures 106) comprises less than a threshold percentage of oxygen atoms. In some embodiments, the threshold percentage of oxygen atoms is thirty percent (30%) (e.g., in embodiments in which the seventh warping reduction structure 107*g* comprises at least thirty percent (30%) oxygen atoms). In other words, in some embodiments in which the fifth capacitor electrode structure 106*e* (and the other capacitor electrode structures 106) comprises the oxygen component, the fifth capacitor electrode structure 106*e* (and the capacitor electrode structures 106) comprises less than thirty percent (30%) of oxygen atoms. In other embodiments, the threshold percentage of oxygen atoms is twenty percent (20%) (e.g., in embodiments in which the seventh warping reduction structure 107*g* comprises at least twenty percent (20%) oxygen atoms).

FIGS. 7-15 illustrate a series of cross-sectional views 700-1500 of some embodiments of a method for forming an integrated chip (IC) comprising a trench capacitor 102 that has a high capacitance density and causes low substrate warpage.

As shown in the cross-sectional view 700 of FIG. 7, a plurality of trenches 104t are formed in a substrate 104 (e.g., semiconductor substrate). The substrate 104 may comprise any type of semiconductor body (e.g., monocrystalline silicon/CMOS bulk, germanium (Ge), a group III-V semiconductor material, silicon-germanium (SiGe), silicon on insulator (SOI), etc.). In some embodiments, forming the trenches 104t also forms a pillar structure 111 of the substrate 104. The pillar structure 111 of the substrate 104 is formed laterally between neighboring ones of the trenches 104t.

In some embodiments, a process for forming the trenches 104t comprises forming a patterned masking layer 702 (e.g., positive/negative photoresist, hardmask, etc.) over the first surface 104f of the substrate 104. The patterned masking layer 702 may be formed by forming a masking layer material on the first surface 104f of the substrate 104 (e.g., via a spin-on process, chemical vapor deposition (CVD), physical vapor deposition (PVD), atomic layer deposition (ALD), thermal oxidation, some other deposition or growth process, or a combination of the foregoing), exposing the masking layer material to a pattern (e.g., via a lithography process, such as photolithography, extreme ultraviolet lithography, or the like), and developing the masking layer material to form the patterned masking layer 702. Thereafter, with the patterned masking layer 702 in place, an etching process is performed on the substrate 104, thereby forming the trenches 104t according to the patterned masking layer 702. The etching process removes unmasked portions of the substrate 104, thereby forming the trenches 104t. In some embodiments, the etching process may be, for example, a reactive ion etching (RIE) process, a wet etching process, a dry etching process, some other etching process, or a combination of the foregoing. The patterned masking layer 702 may be subsequently stripped away (e.g., via a plasma ashing process).

As shown in the cross-sectional view 800 of FIG. 8, a doped region 105 is formed in the substrate 104. The doped region 105 is a region of the substrate 104 having a first doping type (e.g., p-type or n-type). In some embodiments, the doped region 105 may be formed by a doping process (e.g., ion implantation process, a diffusion process, etc.) and may utilize a patterned masking layer (not shown) (e.g., positive/negative photoresist, a hardmask, etc.) to selectively implant first doping type dopant species (e.g., p-type dopants (such as boron (B), aluminum (Al), gallium (Ga), etc.) or n-type dopants (such as phosphorus (P), arsenic (As), antimony (Sb), etc.)) into the substrate 104. In other embodiments, the doping process may be a blanket doping process.

Figure 9:
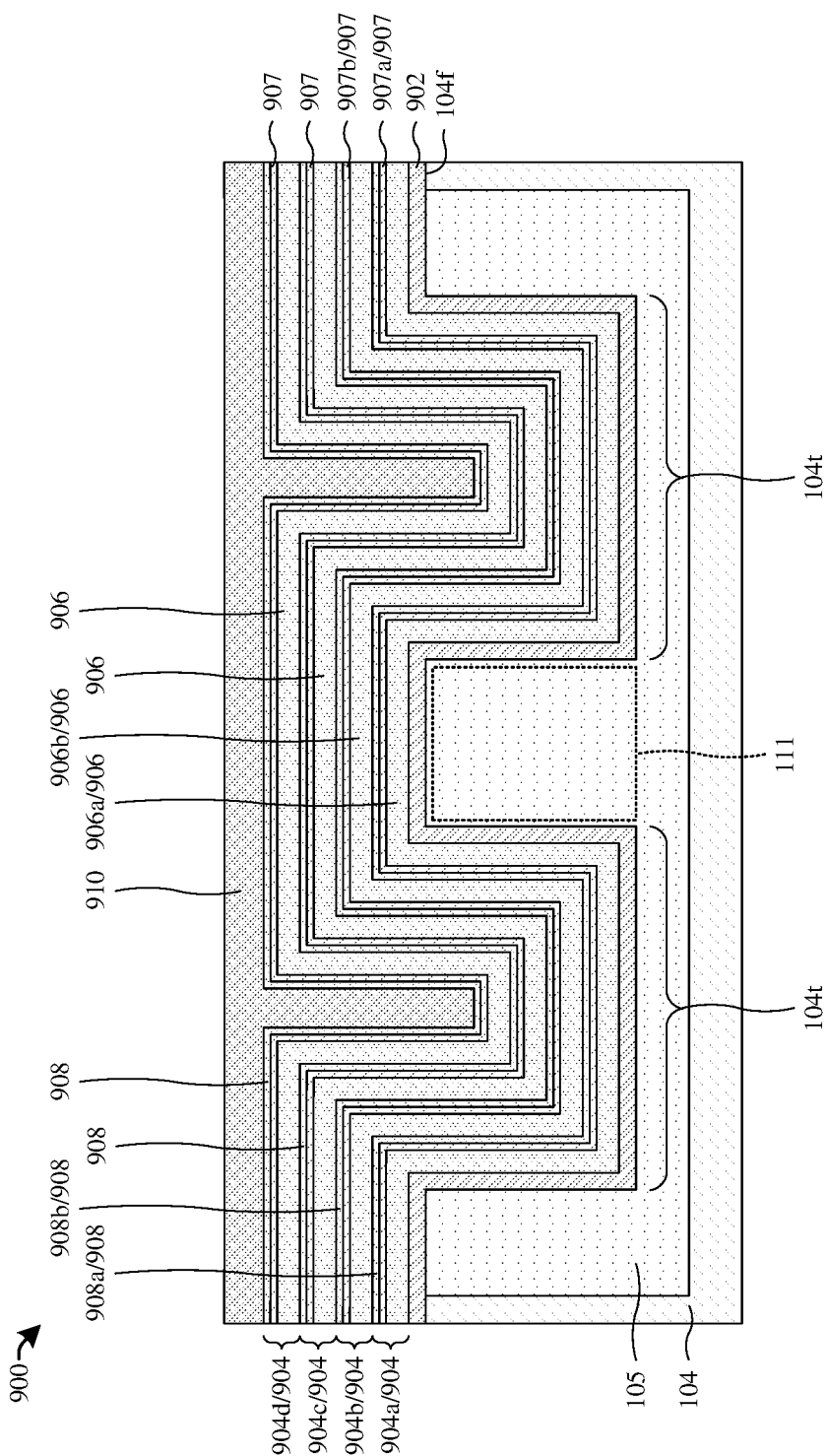
Figure 10:
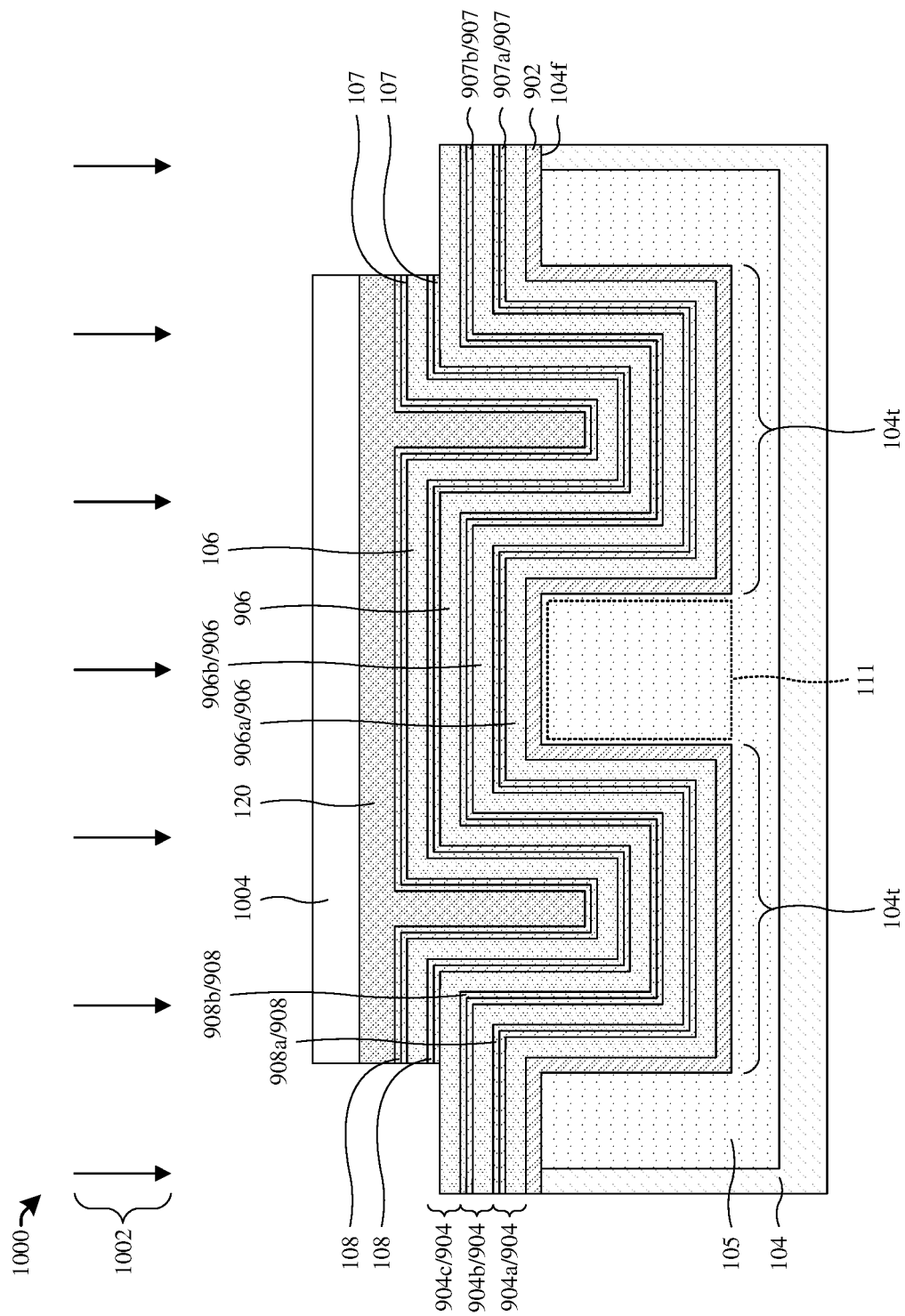

As shown in the cross-sectional view 900 of FIG. 9, in some embodiments, a dielectric liner layer 902 is formed over the substrate 104. The dielectric liner layer 902 may be formed along (e.g., formed lining) the first surface 104f of the substrate 104 and along surfaces (e.g., sidewalls, lower surfaces, etc.) of the substrate 104 that define the trenches 104t and define the pillar structure 111 of the substrate 104. In some embodiments, the dielectric liner layer 902 may be or comprise, for example, an oxide (e.g., $SiO_2$), a nitride (e.g., SiN), a semiconductor-based oxynitride (e.g., SiON), or the like. In some embodiments, a process for forming the dielectric liner layer 902 comprises depositing or growing the dielectric liner layer 902 on the first surface 104f of the substrate 104 and on the surfaces of the substrate 104 that define the trenches 104t and the pillar structure 111. In some embodiments, the dielectric liner layer 902 may be formed by, for example, CVD, PVD, ALD, thermal oxidation, some other deposition or growth process, or a combination of the foregoing.

Also shown in the cross-sectional view 900 of FIG. 9, a plurality of multilayer films 904 are formed over the substrate 104. For example, the plurality of multilayer films 904 may comprise a first multilayer film 904a, a second multilayer film 904b, a third multilayer film 904c, and a fourth multilayer film 904d. The plurality of multilayer films 904 are stacked and disposed in the trenches 104t. The plurality of multilayer films 904 may also be disposed over the pillar structure 111 and/or the first surface 104f of the substrate 104.

Further, the multilayer films 904 comprise capacitor electrode layers 906, warping reduction layers 907, and capacitor dielectric layers 908. For example, the first multilayer film 904a comprises a first capacitor electrode layer 906a, a first warping reduction layer 907a, and a first capacitor dielectric layer 908a; the second multilayer film comprises a second capacitor electrode layer 906b, a second warping reduction layer 907b, and a second capacitor dielectric layer 908b; and so forth. In some embodiments, the capacitor electrode layers 906, the warping reduction layers 907, and the capacitor dielectric layers 908 are alternatingly stacked, such that each of the capacitor electrode layers 906 is spaced from a neighboring one of the capacitor electrode layers 906 by a corresponding one of the warping reduction layers 907 and by a corresponding one of the capacitor dielectric layers 908 and such that the corresponding one of the warping reduction layers 907 is disposed between its corresponding one of the capacitor electrode layers 906 and the one of the capacitor dielectric layers 908 that corresponds to its corresponding one of the capacitor electrode layers 906.

For example, the first warping reduction layer 907a is disposed over the first capacitor electrode layer 906a. The first capacitor dielectric layer 908a is disposed over the first warping reduction layer 907a. The first warping reduction layer 907a is disposed between (e.g., vertically between) the first capacitor dielectric layer 908a and the first capacitor electrode layer 906a. The second capacitor electrode layer 906b is disposed over the first capacitor dielectric layer 908a. The first capacitor electrode layer 906a is spaced from the second capacitor electrode layer 906b. The first capacitor electrode layer 906a neighbors the second capacitor electrode layer 906b. In other words, the first capacitor electrode layer 906a is spaced from the second capacitor electrode layer 906b (which it neighbors) by the first warping reduction layer 907a (which corresponds to the first capacitor electrode layer 906a) and the first capacitor dielectric layer 908a (which also corresponds to the first capacitor electrode layer 906a), and the first warping reduction layer 907a is disposed between the first capacitor electrode layer 906a (which the first warping reduction layer 907a corresponds to) and the first capacitor dielectric layer 908a.

Likewise, the second warping reduction layer 907b is disposed over the second capacitor electrode layer 906b. The second capacitor dielectric layer 908b is disposed over the second warping reduction layer 907b. The second warping reduction layer 907b is disposed between (e.g., vertically between) the second capacitor dielectric layer 908b and the second capacitor electrode layer 906b. In other words, the second capacitor electrode layer 906b is spaced from a third capacitor electrode layer (which overlies and neighbors the second capacitor electrode layer 906b) by the second warping reduction layer 907b (which corresponds to the second capacitor electrode layer 906b) and the second capacitor dielectric layer 908b (which also corresponds to the second capacitor electrode layer 906b), and the second warping reduction layer 907b is disposed between the second capacitor electrode layer 906b (which the second warping reduction layer 907b corresponds to) and the second capacitor dielectric layer 908b.

It will be appreciated that the plurality of multilayer films 904 may comprise other configurations of the capacitor electrode layers 906, the warping reduction layers 907, and the capacitor dielectric layers 908 (see, e.g., FIGS. 2-5). For example, the capacitor electrode layers 906, the warping reduction layers 907, and the capacitor dielectric layers 908 may be alternatingly stacked, such that each of the capacitor electrode layers 906 overlies a corresponding one of the warping reduction layers 907 (see, e.g., FIG. 2); the capacitor electrode layers 906, the warping reduction layers 907, and the capacitor dielectric layers 908 may be alternatingly stacked, such that each of the capacitor electrode layers 906 overlies a first corresponding one of the warping reduction layers 907 and underlies a second corresponding one of the warping reduction layers 907 (see, e.g., FIG. 3); and so forth. It will also be appreciated that the plurality of multilayer films 904 may comprise any number of individual multilayer films (e.g., one (1) multilayer film, two (2) multilayer films, three (3) multilayer films, four (4) multilayer films, five (5) multilayer films, six (6) multilayer films, etc.).

The capacitor electrode layers 906 are stacked over the substrate 104. The capacitor electrode layers 906 are electrically conductive. In some embodiments, the capacitor electrode layers 906 are conformal layers. In some embodiments, the capacitor electrode layers 906 are or comprise a metal nitride, such as titanium nitride (TiN), tantalum nitride (TaN), or the like. In such embodiments, the capacitor electrode layers 906 comprise a metal component (e.g., titanium (Ti) atoms) and a nitrogen component (e.g., nitrogen (N) atoms).

In some embodiments, the capacitor electrode layers 906 are tensile films, respectively. For example, by forming the first capacitor electrode layer 906a (or any other one of the capacitor electrode layers 906) on a surface of a substrate, the first capacitor electrode layer 906a will cause a change in a radius of curvature of the surface of the substrate such that the surface of the substrate adjusts to have a concave geometry (or a more concave geometry). In further embodiments, the capacitor electrode layers 906 may be tensile films due to the capacitor electrode layers 906 having more tensile stress states than compressive stress states (e.g., the capacitor electrode layers 906 are under tensile stress).

The capacitor dielectric layers 908 are disposed between the capacitor electrode layers 906. The capacitor dielectric layers 908 are configured to electrically insulate the capacitor electrode layers 906 from one another. For example, the first capacitor dielectric layer 908a is disposed between the first capacitor electrode layer 906a and the second capacitor electrode layer 906b and electrically insulates the first capacitor electrode layer 906a from the second capacitor electrode layer 906b, and the second capacitor dielectric layer 908b is disposed between the second capacitor electrode layer 906b and the third capacitor electrode layer (which overlies and neighbors the second capacitor electrode layer 906b) and electrically insulates the second capacitor electrode layer 906b from the third capacitor electrode layer, and so forth. In some embodiments, the capacitor dielectric layers 908 are conformal layers.

In some embodiments, the capacitor dielectric layers 908 may be or comprise, for example, a high-k dielectric material, or some other suitable dielectric material(s). The high-k dielectric material may be or comprise, for example, hafnium oxide (HfO), zirconium oxide (ZrO), aluminum oxide (AlO), some other dielectric material with a dielectric constant greater than about 3.9, or a combination of the foregoing. In yet further embodiments, the capacitor dielectric layers 908 may be multi-layer dielectric structures (e.g., comprising a high-k dielectric layer and a base dielectric layer that are different dielectric materials).

In some embodiments, the capacitor dielectric layers 908 are tensile films, respectively. For example, by forming the first capacitor dielectric layer 908a (or any other one of the capacitor dielectric layers 908) on a surface of a substrate, the first capacitor dielectric layer 908a will cause a change in a radius of curvature of the surface of the substrate such that the surface of the substrate adjusts to have a concave geometry (or a more concave geometry). In further embodiments, the capacitor dielectric layers 908 may be tensile films due to the capacitor dielectric layers 908 having more tensile stress states than compressive stress states (e.g., the capacitor dielectric layers 908 are under tensile stress).

Each of the warping reduction layers 907 are disposed between a corresponding one of the capacitor dielectric layers 908 and a corresponding one of the capacitor electrode layers 906. For example, the first warping reduction layer 907a is disposed between the first capacitor electrode layer 906a and the first capacitor dielectric layer 908a, the second warping reduction layer 907b is disposed between the second capacitor electrode layer 906b and the second capacitor dielectric layer 908b, and so forth. In some embodiments, each of the warping reduction layers 907 contacts (e.g., directly contacts) a corresponding one of the capacitor electrode layers 906. For example, the first warping reduction layer 907a contacts (e.g., directly contacts) the first capacitor electrode layer 906a, the second warping reduction layer 907b contacts (e.g., directly contacts) the second capacitor electrode layer 906b, and so forth. In some embodiments, each of the warping reduction layers 907 contacts (e.g., directly contacts) a corresponding one of the capacitor dielectric layers 908. For example, the first warping reduction layer 907a contacts (e.g., directly contacts) the first capacitor dielectric layer 908a, the second warping reduction layer 907b contacts (e.g., directly contacts) the second capacitor dielectric layer 908b, and so forth. In some embodiments, each of the capacitor dielectric layers 908 contacts (e.g., directly contacts) a corresponding one of the capacitor electrode layers 906 and a corresponding one of the warping reduction layers 907. For example, the first capacitor dielectric layer 908a contacts (e.g., directly contacts) the second capacitor electrode layer 906b and contacts (e.g., directly contacts) the first warping reduction layer 907a.

The warping reduction layers 907 comprise the metal component of the capacitor electrode layers 906, the nitrogen component of the capacitor electrode layers 906, and an oxygen component (e.g., oxygen (O) atoms). In further embodiments, the warping reduction layers 907 are or comprise a metal oxynitride, for example, titanium oxynitride ($TiN_yO_x$), tantalum oxynitride ($TaN_yO_x$), or the like. For example, in some embodiments, the capacitor electrode layers 906 are titanium nitride (TiN) and the warping reduction layers 907 are titanium oxynitride ($TiN_yO_x$). In some embodiments, the capacitor electrode layers 906 have a first chemical composition (e.g., TaN) and the warping reduction layers 907 have a second chemical composition (e.g., $TaN_yO_x$) that is different than the first chemical composition. In some embodiments, the warping reduction layers 907 have a thickness. For example, in some embodiments, the first warping reduction layer 907a has the thickness, the second warping reduction layer 907b has the thickness, and so forth. In some embodiments, the thickness is between about 10 Å and about 1000 Å. In further embodiments, the thickness is between about 25 Å and about 65 Å. In some embodiments, the warping reduction layers 907 are electrically conductive.

In some embodiments, the first capacitor electrode layer 906a is disposed nearer the substrate 104 than any other of the capacitor electrode layers 906. In some embodiments, the first warping reduction layer 907a is disposed nearer the substrate 104 than any other of the warping reduction layers 907. In some embodiments, the first capacitor dielectric layer 908a is disposed nearer the substrate 104 than any other of the capacitor dielectric layers 908.

In some embodiments, the first capacitor electrode layer 906a overlies and lines the dielectric liner structure 112. In some embodiments, the first warping reduction layer 907a overlies and lines the first capacitor electrode layer 906a. In some embodiments, the first capacitor dielectric layer 908a overlies and lines the first warping reduction layer 907a. In some embodiments, the second capacitor electrode layer 906b overlies and lines the first capacitor dielectric layer 908a.

In some embodiments, the warping reduction layers 907 are compressive films, respectively. For example, by forming the first warping reduction layer 907a (or any other one of the warping reduction layers 907) on a surface of a substrate, the first warping reduction layer 907a will cause a change in a radius of curvature of the surface of the substrate such that the surface of the substrate adjusts to have a convex geometry (or a more convex geometry). In further embodiments, the warping reduction layers 907 may be compressive films due to the warping reduction layers 907 having more compressive stress states than tensile stress states (e.g., the warping reduction layers 907 are under compressive stress). In some embodiments, the warping reduction layers 907 are compressive films due to the warping reduction layers 907 comprising the metal component, the nitrogen component, and the oxygen component (e.g., if the warping reduction layers 907 did not comprise the oxygen component, the warping reduction layers 907 would be tensile films). For example, the oxygen component may alter bonds (e.g., chemical bonds) in the warping reduction layers 907, thereby causing each of the warping reduction layers 907 to be a compressive film.

In some embodiments, a process for forming the plurality of multilayer films 904 comprises forming the capacitor electrode layers 906, the warping reduction layers 907, and the capacitor dielectric layers 908 over the substrate 104 (and the dielectric liner layer 902). Further, the process for forming the multilayer films 904 comprises forming the multilayer films 904 in a vertical stack over the substrate 104. For example, the second multilayer film 904b is formed over the first multilayer film 904a, the third multilayer film 904c is formed over the second multilayer film 904b, and so forth.

In some embodiments, a process for forming the first multilayer film 904a comprises forming the first capacitor electrode layer 906a over the substrate 104 (and the dielectric liner layer 902); forming the first warping reduction layer 907a over the first capacitor electrode layer 906a; and forming the first capacitor dielectric layer 908a over the first warping reduction layer 907a. In further embodiments, a process for forming the first multilayer film 904a comprises depositing the first capacitor electrode layer 906a on (e.g., directly in contact with) the substrate 104 (or the dielectric liner layer 902); depositing the first warping reduction layer 907a on (e.g., directly in contact with) the first capacitor electrode layer 906a; and depositing the first capacitor dielectric layer 908a on (e.g., directly in contact with) the first warping reduction layer 907a. In further embodiments, the process for forming the first multilayer film 904a may comprise deriving the first warping reduction layer 907a from the first capacitor electrode layer 906a. It will be appreciated that each of the multilayer films 904 may be formed in a substantially similar manner as the first multilayer film 904a is formed. For example, a process for forming the second multilayer film 904b comprises forming (e.g., via a deposition process) the second capacitor electrode layer 906b over/on the first capacitor dielectric layer 908a; forming (e.g., via a deposition process) the second warping reduction layer 907b over/on the second capacitor electrode layer 906b; and forming (e.g., via a deposition process) the second capacitor dielectric layer 908b over/on the second warping reduction layer 907b.

In some embodiments, the capacitor electrode layers 906 may be formed by, for example, CVD, PVD, ALD, electroless plating, electroplating, some other deposition process, or a combination of the foregoing. In some embodiments, the warping reduction layers 907 may be formed by, for example, sputtering (e.g., reactive sputtering), CVD, PVD, ALD, some other deposition process, or a combination of the foregoing. In some embodiments, the capacitor dielectric layers 908 may be formed by, for example, CVD, PVD, ALD, some other deposition process, or a combination of the foregoing. In further embodiments, the capacitor electrode layers 906, the warping reduction layers 907, and/or the capacitor dielectric layers 908 may be formed by one or more conformal deposition processes (e.g., a conformal CVD process, a conformal sputtering process, etc.).

Because the multilayer films 904 are formed with the warping reduction layers 907, respectively, the substrate 104 may warp less than if typical multilayer films (e.g., multilayer films comprising the capacitor electrode layers 906 and the capacitor dielectric layers 908, but not comprising the warping reduction layers 907) were formed over the substrate 104. In other words, because the process for forming the multilayer films 904 comprises forming the warping reduction layers 907, the process for forming the multilayer films 904 may cause the substrate 104 to warp less than a process for forming the typical multilayer films would. For example, by forming the warping reduction layers 907, the warping reduction layers 907 exert physical stresses onto the capacitor electrode layers 906 and/or the capacitor dielectric layers 908. These physical stresses exerted by the warping reduction layers 907 may reduce the physical stresses that the capacitor electrode layers 906 and/or the capacitor dielectric layers 908 exert onto the substrate 104 (e.g., the capacitor electrode layers 906 and/or the capacitor dielectric layers 908 may be tensile films due to the process in which they are formed, and the compressive film stresses of the warping reduction layers 907 may counteract the tensile film stresses of the capacitor dielectric/electrode structures). Accordingly, due to the multilayer films 904 being formed with the warping reduction layers 907, in comparison to a multilayer film stack comprising typical multilayer films, the plurality of multilayer films 904 may be formed with more individual multilayer films while exerting a lower physical stress onto the substrate 104.

In some embodiments, the warping reduction layers 907 are formed via a sputtering process (e.g., RF sputtering, DC sputtering, ion-beam sputtering, diode sputtering, reactive sputtering, magnetron sputtering, etc.). In further embodiments, the sputtering process comprises loading the substrate 104 (and any layers already formed thereon) into a first processing chamber. The first processing chamber may be different than a processing chamber in which the capacitor electrode layers 906 are formed and/or a processing chamber in which the capacitor dielectric layers 908 are formed. In yet further embodiments, the sputtering process comprises flowing a processing gas (e.g., pumping the processing gas) into the first processing chamber. In yet further embodiments, the processing gas is or comprises nitrous oxide ($N_2O$). It will be appreciated that other processing gases are amenable. In some embodiments, by forming the warping reduction layers 907 via the sputtering process, the warping reduction layers 907 may be formed as compressive films. In other words, in some embodiments, the sputtering process causes the warping reduction layers 907 to be formed as compressive films (e.g., other types of formation process may cause the warping reduction layers 907 to be formed as tensile films and/or cause that the warping reduction layers 907 not to be as compressive of compressive films).

In some embodiments, the capacitor electrode layers 906 are formed via an ALD process. In some embodiments, the ALD process may cause the capacitor electrode layers 906 to be formed as compressive films (e.g., if the capacitor electrode layers 906 were formed via a different process, the capacitor electrode layers 906 may not be formed as compressive films (or may be formed as weaker compressive films). In further embodiments, the capacitor dielectric layers 908 are formed by an ALD process. In some embodiments, the ALD process may cause the capacitor dielectric layers 908 to be formed as compressive films (e.g., if the capacitor dielectric layers 908 were formed via a different process, the capacitor dielectric layers 908 may not be formed as compressive films (or may be formed as weaker compressive films).

Also shown in the cross-sectional view 900 of FIG. 9, in some embodiments, a capping dielectric layer 910 is formed over the plurality of multilayer films 904. The capping dielectric layer 910 may be formed along (e.g., formed lining) surfaces (e.g., upper surfaces, sidewalls, etc.) of an uppermost one of the multilayer films 904. For example, as shown in the cross-sectional view 900 of FIG. 9, the capping dielectric layer 910 is formed along surfaces of the fourth multilayer film 904d, which is the uppermost multilayer film of the multilayer films 904 illustrated in the cross-sectional view 900 of FIG. 9.

In some embodiments, the capping dielectric layer 910 may be or comprise, for example, an oxide (e.g., $SiO_2$), a nitride (e.g., SiN), a semiconductor-based oxynitride (e.g., SiON), a low-k dielectric (e.g., a dielectric material with a dielectric constant less than about 3.9), some other dielectric material, or a combination of the foregoing. In some embodiments, a process for forming the capping dielectric layer 910 comprises depositing or growing the capping dielectric layer 910 on the surfaces of the uppermost one of the multilayer films 904. In some embodiments, the capping dielectric layer 910 may be formed by, for example, CVD, PVD, ALD, thermal oxidation, some other deposition or growth process, or a combination of the foregoing.

As shown in the cross-sectional views 1000-1300 of FIGS. 10-13, a plurality of capacitor electrode structures 106, a plurality of warping reduction structures 107, and a plurality of capacitor dielectric structures 108 are formed alternatively stacked over the substrate 104. The plurality of capacitor electrode structures 106 are formed by selectively removing portions of the capacitor electrode layers 906. The plurality of warping reduction structures 107 are formed by selectively removing portions of the plurality of warping reduction layers 907. The plurality of capacitor dielectric structures 108 are formed by selectively removing portions of the plurality of capacitor dielectric layers 908.

In some embodiments, a process for forming the plurality of capacitor electrode structures 106, the plurality of warping reduction structures 107, and the plurality of capacitor dielectric structures 108 comprises sequentially performing patterning processes on the structure illustrated in the cross-sectional view 900 of FIG. 9. The sequential patterning processes selectively remove the portions of the capacitor electrode layers 906, thereby leaving remaining portions of the capacitor electrode layers 906 in place as the capacitor electrode structures 106. The sequential patterning processes selectively remove the portions of the warping reduction layers 907, thereby leaving remaining portions of the warping reduction layers 907 in place as the warping reduction structures 107. The sequential patterning processes selectively remove the portions of the capacitor dielectric layers 908, thereby leaving remaining portions of the capacitor dielectric layers 908 in place as the capacitor dielectric structures 108. In some embodiments, the sequential patterning processes sequentially pattern the multilayer films 904 by beginning with the patterning of an uppermost one of the multilayer films 904 and ending with the patterning of a lowermost one of the multilayer films 904.

Figure 12:
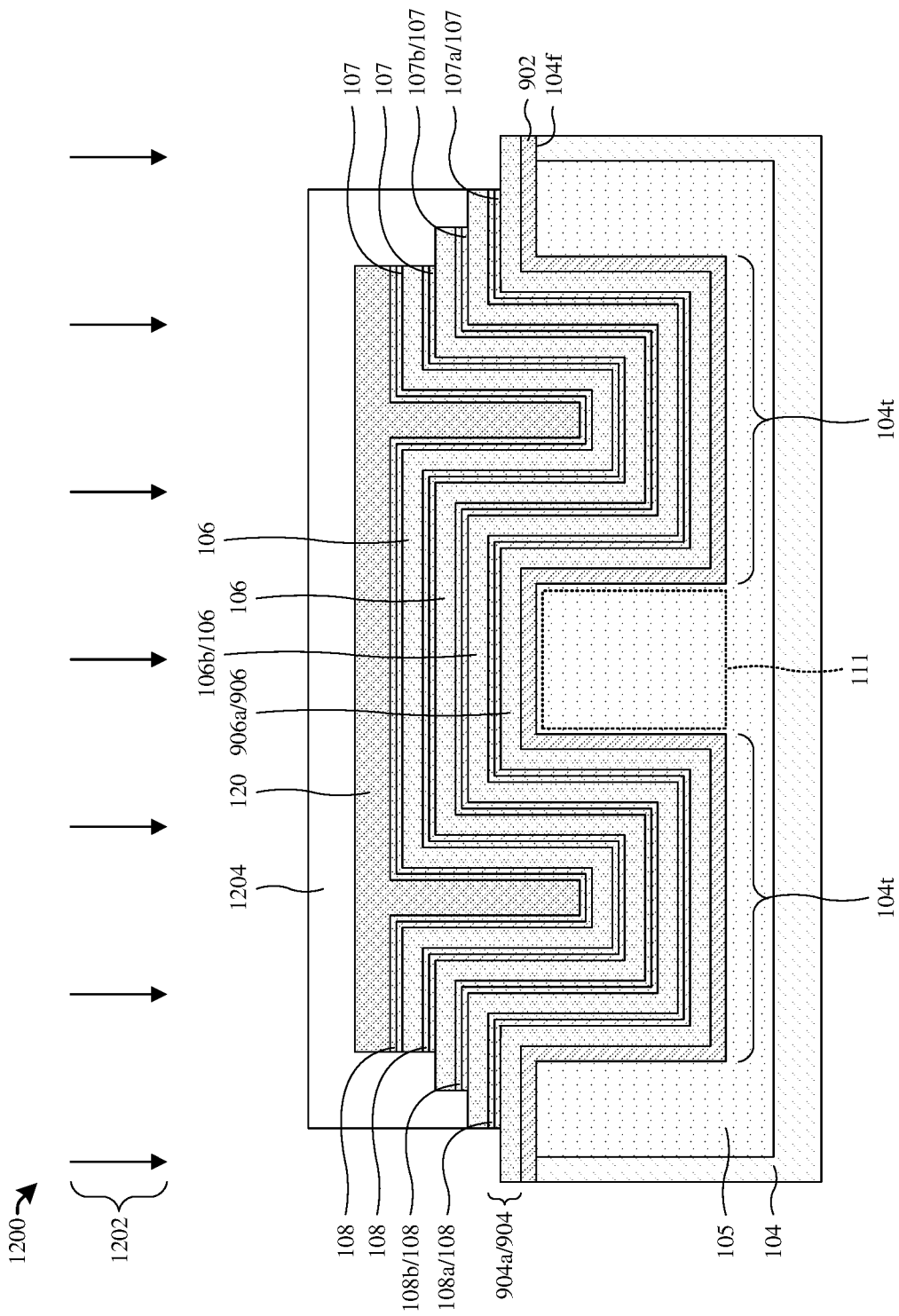
Figure 13:
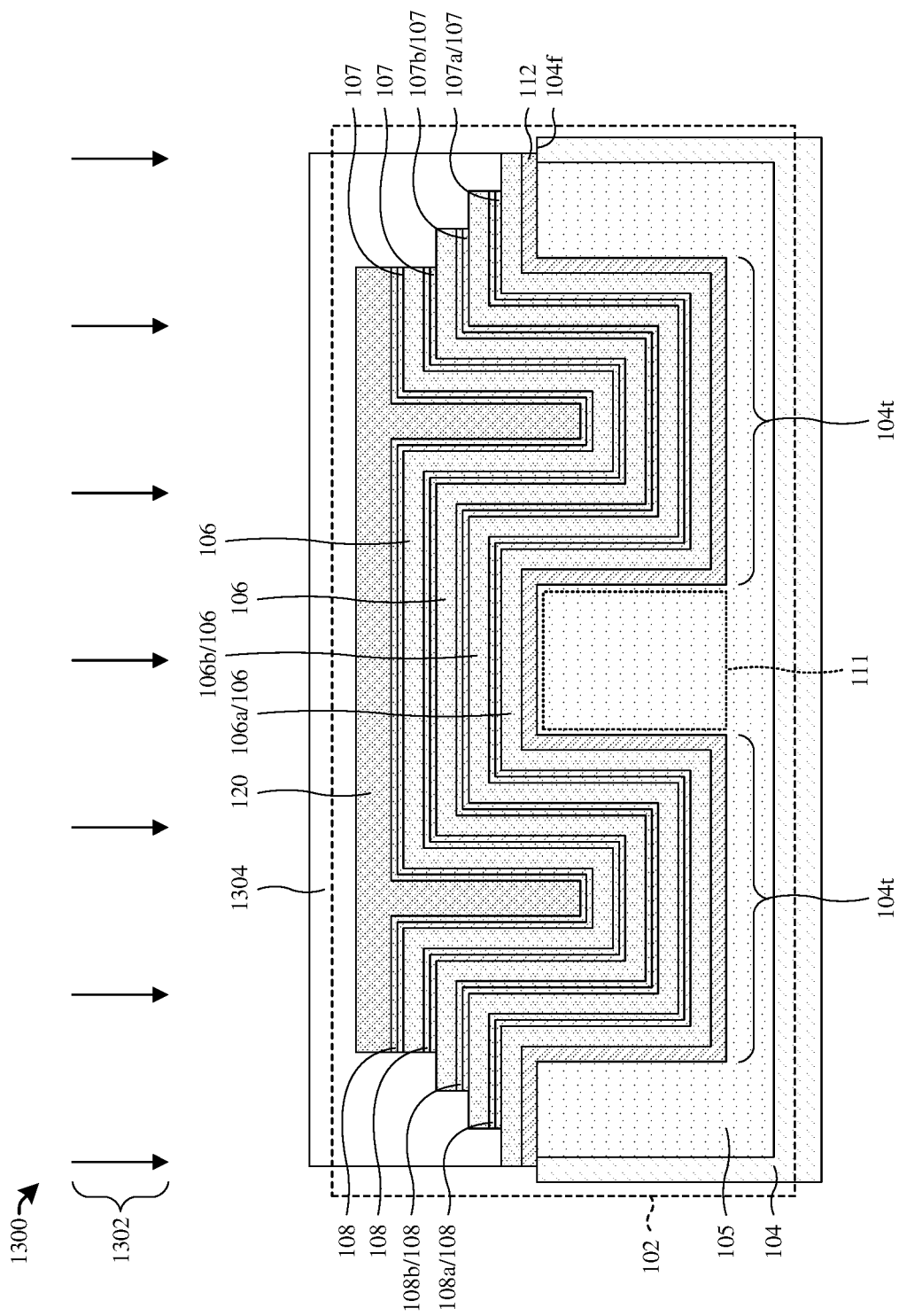

For example, in some embodiments, a process for forming the plurality of capacitor electrode structures 106, the plurality of warping reduction structures 107, and the plurality of capacitor dielectric structures 108 comprises performing a first patterning process 1002 (see, e.g., FIG. 10), a second patterning process 1102 (see, e.g., FIG. 11), a third patterning process 1202 (see, e.g., FIG. 12), and a fourth patterning process 1302 (see, e.g., FIG. 13). The second patterning process 1102 is performed after the first patterning process 1002. The third patterning process 1202 is performed after the second patterning process 1102. The fourth patterning process 1302 is performed after the third patterning process 1202.

The first patterning process 1002 comprises forming a first patterned masking layer 1004 (e.g., a positive/negative photoresist, a hardmask, etc.) over/on the multilayer films 904. In some embodiments, the first patterned masking layer 1004 is formed over/on the capping dielectric layer 910 (see, e.g., FIG. 9). The first patterned masking layer 1004 may be formed by depositing a masking layer material on the capping dielectric layer 910 (e.g., via a spin-on process), exposing the masking layer material to a pattern (e.g., via a lithography process, such as photolithography, extreme ultraviolet lithography, or the like), and developing the masking layer material to form the first patterned masking layer 1004.

Thereafter, with the first patterned masking layer 1004 in place, a first etching process is performed on the fourth multilayer film 904d, thereby patterning the fourth multilayer film 904d according to the first patterned masking layer 1004. The first etching process removes unmasked portions of the capacitor dielectric layer 908 of the fourth multilayer film 904d, thereby leaving remaining portions of the capacitor dielectric layer 908 of the fourth multilayer film 904d in place as one of the plurality of capacitor dielectric structures 108. The first etching process also removes unmasked portions of the warping reduction layer 907 of the fourth multilayer film 904d, thereby leaving remaining portions of the warping reduction layer 907 of the fourth multilayer film 904d in place as one of the plurality of warping reduction structures 107. The first etching process also removes unmasked portions of the capacitor electrode layer 906 of the fourth multilayer film 904d, thereby leaving remaining portions of the capacitor electrode layer 906 of the fourth multilayer film 904d in place as one of the plurality of capacitor electrode structures 106.

In some embodiments, the first etching process is also performed partially on the third multilayer film 904c. For example, as shown in the cross-sectional view 1000 of FIG. 10, the first etching process may remove unmasked portions of the capacitor dielectric layer 908 of the third multilayer film 904c, thereby leaving remaining portions of the capacitor dielectric layer 908 of the third multilayer film 904c in place as another one of the plurality of capacitor dielectric structures 108. Further, the first etching process may also remove unmasked portions of the warping reduction layer 907 of the third multilayer film 904c, thereby leaving remaining portions of the warping reduction layer 907 of the third multilayer film 904c in place as another one of the plurality of warping reduction structures 107. In some embodiments, the first etching process stops on the capacitor electrode layer 906 of the third multilayer film 904c (e.g., the capacitor electrode layer 906 of the third multilayer film 904c acts as an etch stop for the first etching process).

In some embodiments, the first etching process may be, for example, a wet etching process, a dry etching process, a reactive ion etching (RIE) process, some other etching process, or a combination of the foregoing. In further embodiments, the first etching process may comprise multiple etching steps. For example, the first etching process may comprise a first etching step, a second etching step, and a third etching step. The second etching step is performed after the first etching step, and the third etching step is performed after the second etching step.

The first etching step may comprise exposing the capacitor dielectric layer 908 and the warping reduction layer 907 of the fourth multilayer film 904d to a first etchant that selectively removes the unmasked portions of the capacitor dielectric layer 908 of the fourth multilayer film 904d and the unmasked portions of the warping reduction layer 907 of the fourth multilayer film 904d. In some embodiments, the first etching step stops on the capacitor electrode layer 906 of the fourth multilayer film 904d (e.g., the capacitor electrode layer 906 of the fourth multilayer film 904d acts as an etch stop for the first etching step). In some embodiments, the first etching step may be or comprise, for example, a wet etching process, a dry etching process, a RIE process, some other etching process, or a combination of the foregoing.

The second etching step may comprise exposing the capacitor electrode layer 906 of the fourth multilayer film 904d to a second etchant different than the first etchant to selectively remove the unmasked portions of the capacitor electrode layer 906 of the fourth multilayer film 904d. In some embodiments, the second etching step stops on the capacitor dielectric layer 908 of the third multilayer film 904c (e.g., the capacitor dielectric layer 908 of the third multilayer film 904c acts as an etch stop for the second etching step). In some embodiments, the second etching step may be or comprise, for example, a wet etching process, a dry etching process, a RIE process, some other etching process, or a combination of the foregoing.

The third etching step may comprise exposing the capacitor dielectric layer 908 and the warping reduction layer 907 of the third multilayer film 904c to a third etchant different than the second etchant to selectively remove the unmasked portions of the capacitor dielectric layer 908 of the third multilayer film 904c and the unmasked portions of the warping reduction layer 907 of the third multilayer film 904c. In some embodiments, the third etching step stops on the capacitor electrode layer 906 of the third multilayer film 904c (e.g., the capacitor electrode layer 906 of the third multilayer film 904c acts as an etch stop for the third etching step). In some embodiments, the first etchant and the third etchant have a substantially similar etchant composition. In some embodiments, the third etching step may be or comprise, for example, a wet etching process, a dry etching process, a RIE process, some other etching process, or a combination of the foregoing.

It will be appreciated that the first, second, and third etching steps may etch different layers of the multilayer films 904 than described above. For example, the first etching step may etch the capacitor dielectric layer 908 of the fourth multilayer film 904d, the second etching step may etch the warping reduction layer 907 of the fourth multilayer film 904d and the capacitor electrode layer 906 of the fourth multilayer film 904d, and the third etching step may etch the capacitor dielectric layer 908 of the third multilayer film 904c.

Figure 11:
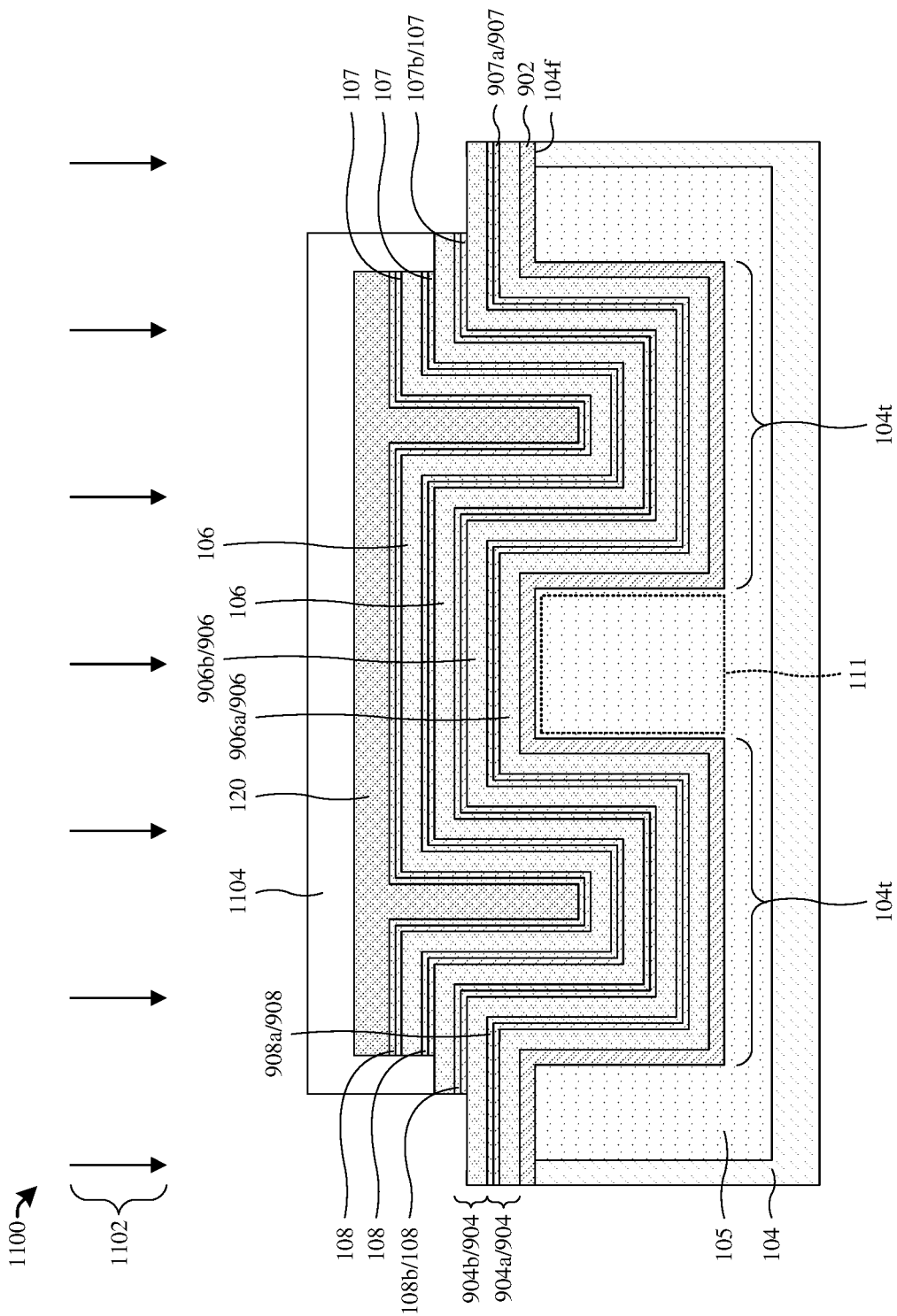

After the first patterning process 1002, the second patterning process 1102 is performed (see, FIG. 11). The second patterning process 1102 comprises forming a second patterned masking layer 1104 (e.g., a positive/negative photoresist, a hardmask, etc.) over/on the previously formed capacitor dielectric structures 108, warping reduction structures 107, and capacitor electrode structure(s) 106. The second patterned masking layer 1104 is also formed over the remaining multilayer films 904. In some embodiments, the second patterned masking layer 1104 is also formed over the capping dielectric structure 120. The second patterned masking layer 1104 may be formed in a substantially similar manner as the first patterned masking layer 1004.

Thereafter, with the second patterned masking layer 1104 in place, a second etching process is performed on the third multilayer film 904c and on the second multilayer film 904b. The second etching process removes unmasked portions of the capacitor electrode layer 906 of the third multilayer film 904c, thereby leaving remaining portions of the capacitor electrode layer 906 of the third multilayer film 904c in place as another one of the plurality of capacitor electrode structures 106. The second etching process also removes unmasked portions of the capacitor dielectric layer 908 of the second multilayer film 904b, thereby leaving remaining portions of the capacitor dielectric layer 908 of the second multilayer film 904b in place as another one of the plurality of capacitor dielectric structures 108 (e.g., the second capacitor dielectric structure 108b). The second etching process also removes unmasked portions of the warping reduction layer 907 of the second multilayer film 904b, thereby leaving remaining portions of the warping reduction layer 907 of the second multilayer film 904b in place as another one of the plurality of warping reduction structures 107 (e.g., the second warping reduction structure 107b). In some embodiments, the second etching process stops on the capacitor electrode layer 906 of the second multilayer film 904b (e.g., the capacitor electrode layer 906 of the second multilayer film 904b acts as an etch stop for the second etching process).

In some embodiments, the second etching process may be, for example, a wet etching process, a dry etching process, a RIE process, some other etching process, or a combination of the foregoing. In further embodiments, the second etching process may comprise multiple etching steps. For example, the second etching process may comprise a fourth etching step and a fifth etching step. The fifth etching step is performed after the fourth etching step.

The fourth etching step may comprise exposing the capacitor electrode layer 906 of the third multilayer film 904c to a fourth etchant to selectively remove the unmasked portions of the capacitor electrode layer 906 of the third multilayer film 904c. The fourth etching step may be substantially the same as the second etching step (e.g., comprise substantially the same etching/etchant parameters). The fifth etching step may comprise exposing the capacitor dielectric layer 908 and the warping reduction layer 907 of the second multilayer film 904b to a fifth etchant that selectively removes the unmasked portions of the capacitor dielectric layer 908 of the second multilayer film 904b and the unmasked portions of the warping reduction layer 907 of the second multilayer film 904b. The fifth etching step may be substantially the same as the first etching step (and/or the third etching step) (e.g., comprise substantially the same etching/etchant parameters).

After the second patterning process 1102, the third patterning process 1202 is performed (see, FIG. 12). The third patterning process 1202 comprises forming a third patterned masking layer 1204 (e.g., a positive/negative photoresist, a hardmask, etc.) over/on the previously formed capacitor dielectric structures 108, warping reduction structures 107, and capacitor electrode structures 106. The third patterned masking layer 1204 is also formed over the remaining multilayer films 904. In some embodiments, the third patterned masking layer 1204 is also formed over the capping dielectric structure 120. The third patterned masking layer 1204 may be formed in a substantially similar manner as the first patterned masking layer 1004.

Thereafter, with the third patterned masking layer 1204 in place, a third etching process is performed on the second multilayer film 904b and on the first multilayer film 904a. The third etching process removes unmasked portions of the capacitor electrode layer 906 of the second multilayer film 904b, thereby leaving remaining portions of the capacitor electrode layer 906 of the second multilayer film 904b in place as another one of the plurality of capacitor electrode structures 106 (e.g., the second capacitor electrode structure 106b). The third etching process also removes unmasked portions of the capacitor dielectric layer 908 of the first multilayer film 904a, thereby leaving remaining portions of the capacitor dielectric layer 908 of the first multilayer film 904a in place as another one of the plurality of capacitor dielectric structures 108 (e.g., the first capacitor dielectric structure 108a). The third etching process also removes unmasked portions of the warping reduction layer 907 of the first multilayer film 904a, thereby leaving remaining portions of the warping reduction layer 907 of the first multilayer film 904a in place as another one of the plurality of warping reduction structures 107 (e.g., the first warping reduction structure 107a). In some embodiments, the third etching process stops on the capacitor electrode layer 906 of the first multilayer film 904a (e.g., the capacitor electrode layer 906 of the first multilayer film 904a acts as an etch stop for the second etching process). In some embodiments, the third etching process may be, for example, a wet etching process, a dry etching process, a RIE process, some other etching process, or a combination of the foregoing. In further embodiments, the third etching process may be performed in a substantially similar manner as the second etching process.

After the third patterning process 1202, the fourth patterning process 1302 is performed (see, FIG. 13). The fourth patterning process 1302 comprises forming a fourth patterned masking layer 1304 (e.g., a positive/negative photoresist, a hardmask, etc.) over/on the previously formed capacitor dielectric structures 108, warping reduction structures 107, and capacitor electrode structures 106. The fourth patterned masking layer 1304 is also formed over any portions of the remaining one(s) of the multilayer films 904 (e.g., the capacitor electrode layer 906 of the first multilayer film 904a). In some embodiments, the fourth patterned masking layer 1304 is also formed over the capping dielectric structure 120. The fourth patterned masking layer 1304 may be formed in a substantially similar manner as the first patterned masking layer 1004.

Thereafter, with the fourth patterned masking layer 1304 in place, a fourth etching process is performed on the first multilayer film 904a. The fourth etching process removes unmasked portions of the capacitor electrode layer 906 of the first multilayer film 904a, thereby leaving remaining portions of the capacitor electrode layer 906 of the first multilayer film 904a in place as another one of the plurality of capacitor electrode structures 106 (e.g., the first capacitor electrode structure 106a). In some embodiments, the fourth etching process stops on the substrate 104. In other embodiments, the fourth etching process may stop on some other layer/structure disposed vertically between the substrate 104 and the capacitor electrode layer 906 of the first multilayer film 904a. In some embodiments, the fourth etching process may be, for example, a wet etching process, a dry etching process, a RIE process, some other etching process, or a combination of the foregoing. In some embodiments, forming the plurality of capacitor electrode structures 106, the plurality of warping reduction structures 107, and the plurality of capacitor dielectric structures 108 completes formation of a trench capacitor 102. It will be appreciated that, in embodiments in which the warping reduction layers 907 are derived from corresponding capacitor electrode layers 906, the warping reduction structures 107 have been derived from corresponding capacitor electrode structures 106. For example, the first warping reduction structure 107a may be derived from the first capacitor electrode structure 106a, the second warping reduction structure 107b may be derived from the second capacitor electrode structure 106b, and so forth.

Also shown in the cross-sectional views 1000-1300 of FIGS. 10-13 (see, e.g., FIG. 10), in some embodiments, a capping dielectric structure 120 is formed over the plurality of multilayer films 904. The capping dielectric structure 120 is formed by selectively removing portions of the capping dielectric layer 910. In some embodiments, the plurality of capacitor electrode structures 106, the plurality of warping reduction structures 107, and the plurality of capacitor dielectric structures 108 are formed vertically between the substrate 104 and the capping dielectric structure 120. In some embodiments, the capping dielectric structure 120 is formed via the first patterning process 1002, as shown in the cross-sectional view 1000 of FIG. 10.

Also shown in the cross-sectional views 1000-1300 of FIGS. 10-13 (see, e.g., FIG. 13), in some embodiments, a dielectric liner structure 112 is formed over the substrate 104. The dielectric liner structure 112 is formed by selectively removing portions of the dielectric liner layer 902. In some embodiments, the dielectric liner structure 112 is formed vertically between the substrate 104 and the plurality of capacitor electrode structures 106, vertically between the substrate 104 and the plurality of warping reduction structures 107, and vertically between the substrate 104 and the plurality of capacitor dielectric structures 108. In some embodiments, the dielectric liner structure 112 is formed via the fourth patterning process 1302, as shown in the cross-sectional view 1300 of FIG. 13.

Figure 14:
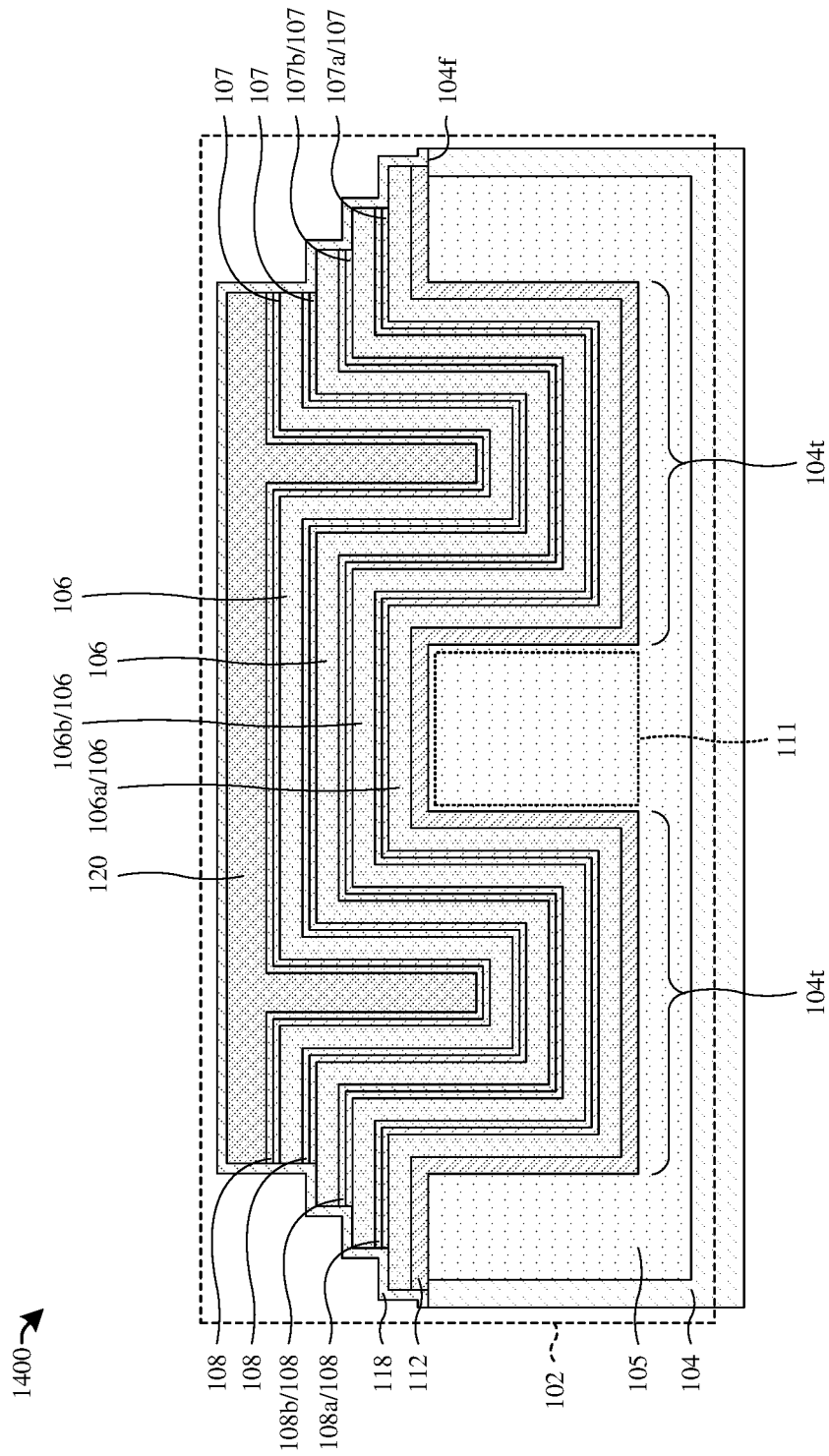

As shown in the cross-sectional view 1400 of FIG. 14, an etch stop layer 118 may be formed overlying and lining the trench capacitor 102. The etch stop layer 118 may also be formed overlying and lining the first surface 104f of the substrate 104. In some embodiments, the etch stop layer 118 is formed overlying and lining the capping dielectric structure 120 and/or the dielectric liner structure 112. In some embodiments, a process for forming the etch stop layer 118 comprises depositing the etch stop layer 118 on the trench capacitor 102 by, for example, CVD, PVD, ALD, some other deposition process, or a combination of the foregoing.

Figure 15:
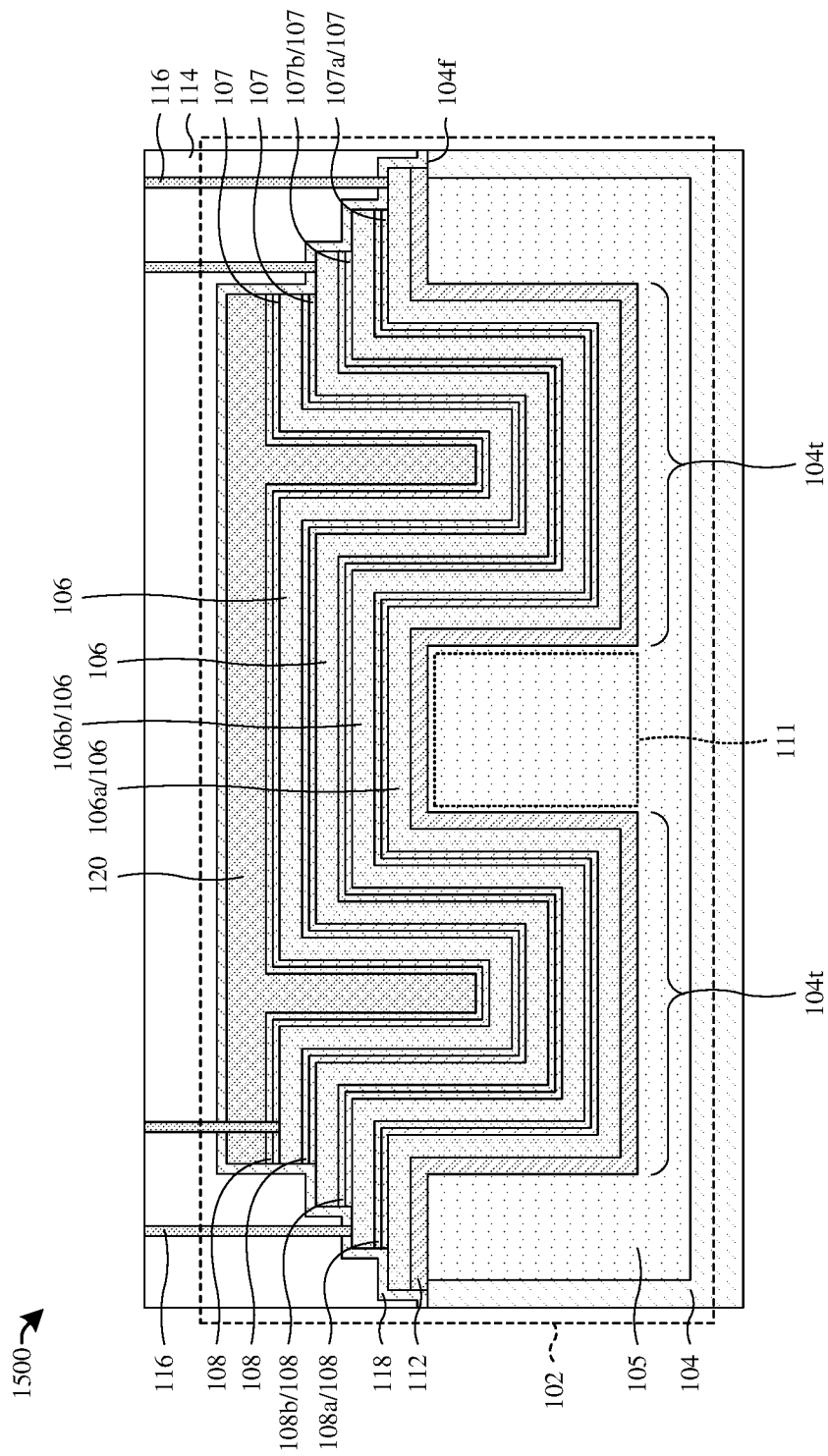

As shown in the cross-sectional view 1500 of FIG. 15, an ILD structure 114 is formed over the trench capacitor 102 and the substrate 104. In further embodiments, the ILD structure 114 is formed over the trench capacitor 102, the substrate 104, the capping dielectric structure 120, the dielectric liner structure 112, and the etch stop layer 118. In some embodiments, a process for forming the ILD structure 114 comprises depositing the ILD structure 114 over the etch stop layer 118 by, for example, CVD, PVD, ALD, a spin-on process, some other deposition process, or a combination of the foregoing. In some embodiments, a planarization process (e.g., a chemical mechanical polishing (CMP) process, and etch back process, etc.) is performed on the ILD structure 114 to planarize an upper surface of the ILD structure 114.

Also shown in the cross-sectional view 1500 of FIG. 15, a plurality of conductive contacts 116 (e.g., metal contacts) are formed in the ILD structure 114 and over the trench capacitor 102. The plurality of conductive contacts 116 are formed electrically coupled to and extending from the plurality of capacitor electrode structures 106, respectively. In some embodiments, a process for forming the plurality of conductive contacts 116 comprises selectively etching the ILD structure 114 to form a plurality of contact openings in the ILD structure 114. Thereafter, a conductive layer (e.g., tungsten (W)) is formed filling the contact openings and overlying the ILD structure 114. A planarization process (e.g., a CMP process, an etch back process, etc.) is then performed on the conductive layer, thereby leaving remaining portions of the conductive layer in the contact openings as the plurality of conductive contacts 116.

While not shown in the cross-sectional view 1500 of FIG. 15, it will be appreciated that the plurality of conductive contacts 116 may be part of an interconnect structure (e.g., copper interconnect structure) that is disposed in the ILD structure 114. Thus, it will be appreciated that any number of additional conductive features of the interconnect structure (e.g., metal lines, metal vias, etc.) may be formed over/in the ILD structure 114.

Figure 16:
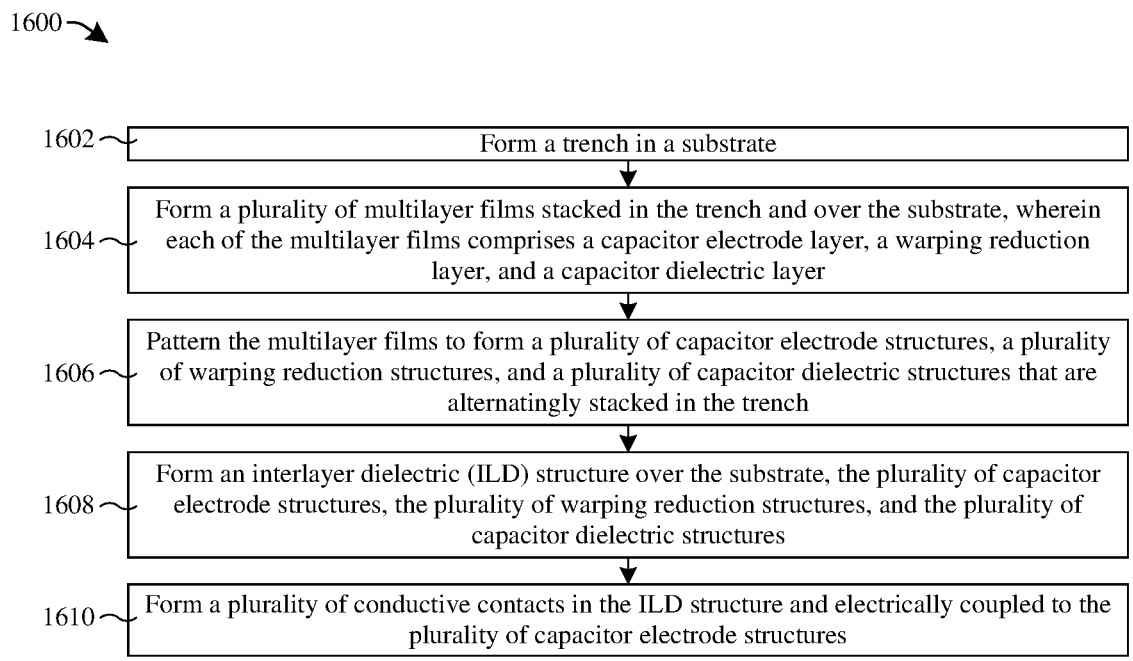
FIG. 16 illustrates a flowchart of some embodiments of a method for forming an integrated chip (IC) comprising a trench capacitor that has a high capacitance density and causes low substrate warpage.

FIG. 16 illustrates a flowchart 1600 of some embodiments of a method for forming an integrated chip (IC) comprising a trench capacitor that has a high capacitance density and causes low substrate warpage. While the flowchart 1600 of FIG. 16 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At act 1602, a trench is formed in a substrate. FIG. 7 illustrates a cross-sectional view 700 of some embodiments corresponding to act 1602.

At act 1604, a plurality of multilayer films are formed stacked in the trench and over the substrate, where each of the multilayer films comprises a capacitor electrode layer, a warping reduction layer, and a capacitor dielectric layer. FIGS. 8-9 illustrate a series of cross-sectional views 800-900 of some embodiments corresponding to act 1604.

At act 1606, the multilayer films are patterned to form a plurality of capacitor electrode structures, a plurality of warping reduction structures, and a plurality of capacitor dielectric structures that are alternatingly stacked in the trench. FIGS. 10-13 illustrate a series of cross-sectional views 1000-1300 of some embodiments corresponding to act 1606.

At act 1608, an interlayer dielectric (ILD) structure is formed over the substrate, the plurality of capacitor electrode structures, the plurality of warping reduction structures, and the plurality of capacitor dielectric structures. FIGS. 14-15 illustrate a series of cross-sectional views 1400-1500 of some embodiments corresponding to act 1608.

At act 1610, a plurality of conductive contacts are formed in the ILD structure and electrically coupled to the plurality of capacitor electrode structures. FIG. 15 illustrates a cross-sectional view 1500 of some embodiments corresponding to act 1610.

In some embodiments, the present application provides an integrated chip (IC). The IC comprises a semiconductor substrate. A trench capacitor overlies the semiconductor substrate. The trench capacitor comprises a plurality of capacitor electrode structures, a plurality of warping reduction structures, and a plurality of capacitor dielectric structures. The plurality of capacitor electrode structures, the plurality of warping reduction structures, and the plurality of capacitor dielectric structures are alternatingly stacked and define a trench segment that extends vertically into the semiconductor substrate. The plurality of capacitor electrode structures comprise a metal component and a nitrogen component. The plurality of warping reduction structures comprise the metal component, the nitrogen component, and an oxygen component.

In some embodiments, the present application provides an integrated chip (IC). The IC comprises a semiconductor substrate. A trench capacitor overlies a surface of the semiconductor substrate, wherein: the trench capacitor comprises a first trench segment and a second trench segment that both extend into the semiconductor substrate by penetrating the surface of the semiconductor substrate; the first trench segment is separated from the second trench segment by a pillar structure of the semiconductor substrate; the trench capacitor extends laterally over the pillar structure of the semiconductor substrate; the trench capacitor comprises a first capacitor electrode structure; the trench capacitor comprises a warping reduction structure overlying and lining the first capacitor electrode structure; the trench capacitor comprises a capacitor dielectric structure overlying and lining the warping reduction structure; the first capacitor electrode structure has a first chemical composition; and the warping reduction structure has a second chemical composition different than the first chemical composition.

In some embodiments, the present application provides a method for forming an integrated chip (IC). The method comprises forming a trench in a semiconductor substrate. A capacitor electrode layer is formed along sidewalls of the trench, wherein the capacitor electrode layer is formed as a compressive film. A first warping reduction layer is formed over the capacitor electrode layer and lining the capacitor electrode layer, wherein the first warping reduction layer is formed as a tensile film. A capacitor dielectric layer is formed over the first warping reduction layer and lining the first warping reduction layer. The capacitor electrode layer, the first warping reduction layer, and the capacitor dielectric layer are etched to respectively form a capacitor electrode structure, a warping reduction structure, and a capacitor dielectric structure stacked in the trench.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip (IC) comprising:
a semiconductor substrate; and
a trench capacitor overlying the semiconductor substrate, wherein the trench capacitor comprises a plurality of capacitor electrode structures, a plurality of warping reduction structures, and a plurality of capacitor dielectric structures, wherein the plurality of capacitor electrode structures, the plurality of warping reduction structures, and the plurality of capacitor dielectric structures are alternatingly stacked and define a trench segment that extends vertically into the semiconductor substrate, wherein the plurality of capacitor electrode structures comprise a metal component and a nitrogen component, wherein the plurality of warping reduction structures comprise the metal component, the nitrogen component, and an oxygen component, and wherein the plurality of warping reduction structures comprise a warping reduction structure that has an atomic percentage of oxygen that is at least twenty percent (20%).

2. The IC of claim 1, wherein the metal component is titanium (Ti).

3. The IC of claim 1, wherein:
the plurality of capacitor electrode structures are titanium nitride (TiN); and
the plurality of warping reduction structures are titanium oxynitride ($TiN_YO_X$).

4. The IC of claim 1, wherein:
the metal component comprises a plurality of metal atoms;
the nitrogen component comprises a plurality of nitrogen atoms; and
the oxygen component comprises a plurality of oxygen atoms.

5. The IC of claim 4, wherein:
a sum of the plurality of metal atoms, the plurality of nitrogen atoms, and the plurality of oxygen atoms is equal to a value; and
the plurality of oxygen atoms accounts for at least thirty percent (30%) of the value.

6. The IC of claim 1, wherein the plurality of warping reduction structures are conductive.

7. The IC of claim 6, wherein:
the plurality of capacitor electrode structures comprise a capacitor electrode structure that is disposed nearer the semiconductor substrate than any other of the plurality of capacitor electrode structures;

the plurality of warping reduction structures comprise an additional warping reduction structure that is disposed nearer the semiconductor substrate than any other of the plurality of warping reduction structures;
the plurality of capacitor dielectric structures comprise a capacitor dielectric structure that is disposed nearer the semiconductor substrate than any other of the plurality of capacitor dielectric structures;
the capacitor electrode structure is disposed between the additional warping reduction structure and the semiconductor substrate; and
the additional warping reduction structure is disposed between the capacitor dielectric structure and the capacitor electrode structure.

8. The IC of claim 1, wherein each of the plurality of warping reduction structures directly contacts a corresponding one of the plurality of capacitor electrode structures.

9. The IC of claim 8, wherein each of the plurality of warping reduction structures directly contacts a corresponding one of the plurality of capacitor dielectric structures.

10. The IC of claim 9, wherein each of the plurality of capacitor dielectric structures directly contacts a corresponding one of the plurality of capacitor electrode structures.

11. The IC according to claim 1, wherein the plurality of capacitor electrode structures comprise a capacitor electrode structure directly contacting the warping reduction structure, and wherein a maximum lateral width of the capacitor electrode structure in a cross-sectional plane is greater than a maximum lateral width of the warping reduction structure in the cross-sectional plane.

12. The IC according to claim 1, wherein the plurality of capacitor electrode structures comprise a capacitor electrode structure directly contacting the warping reduction structure, and wherein the atomic percentage of oxygen in the warping reduction structure increases continuously away from the capacitor electrode structure.

13. The IC of claim 1, wherein the atomic percentage of oxygen in the warping reduction structure is at least thirty percent (30%).

14. An integrated chip (IC) comprising:
a semiconductor substrate;
a trench capacitor overlying a surface of the semiconductor substrate, wherein:
the trench capacitor comprises a first trench segment and a second trench segment that both extend into the semiconductor substrate by penetrating the surface of the semiconductor substrate;
the first trench segment is separated from the second trench segment by a pillar structure of the semiconductor substrate;
the trench capacitor extends laterally over the pillar structure of the semiconductor substrate;
the trench capacitor comprises a first capacitor electrode structure;
the trench capacitor comprises a warping reduction structure overlying and lining the first capacitor electrode structure;
the trench capacitor comprises a capacitor dielectric structure overlying and lining the warping reduction structure;
the first capacitor electrode structure has a first chemical composition;
the warping reduction structure has a second chemical composition different than the first chemical composition;

the first capacitor electrode structure is a compressive film; and
the warping reduction structure is a tensile film.

15. The IC of claim 14, wherein the capacitor dielectric structure is a compressive film.

16. A method for forming a trench capacitor, the method comprising:
forming a trench in a semiconductor substrate;
forming a capacitor electrode layer along sidewalls of the trench, wherein the capacitor electrode layer is formed as a compressive film;
forming a first warping reduction layer over the capacitor electrode layer and lining the capacitor electrode layer, wherein the first warping reduction layer is formed as a tensile film;
forming a capacitor dielectric layer over the first warping reduction layer and lining the first warping reduction layer; and
etching the capacitor electrode layer, the first warping reduction layer, and the capacitor dielectric layer to respectively form a capacitor electrode structure, a warping reduction structure, and a capacitor dielectric structure stacked in the trench.

17. The method of claim 16, wherein:
the capacitor electrode layer comprises a metal component and a nitrogen component;
the first warping reduction layer comprises the metal component, the nitrogen component, and an oxygen component; and
the capacitor dielectric layer has a chemical composition that is different than both a chemical composition of the capacitor electrode layer and a chemical composition of the first warping reduction layer.

18. The method of claim 16, wherein the first warping reduction layer is formed directly on the capacitor electrode layer via a sputtering process.

19. The method of claim 16, further comprising:
before the capacitor electrode layer is formed, forming a second warping reduction layer along the sidewalls of the trench, wherein the capacitor electrode layer is formed over and lining the second warping reduction layer.

20. The method of claim 16, wherein the first warping reduction layer is derived from the capacitor electrode layer.

* * * * *